US009495265B2

(12) United States Patent
Grey

(10) Patent No.: US 9,495,265 B2
(45) Date of Patent: Nov. 15, 2016

(54) TEST EXECUTIVE SYSTEM WITH PROCESSING OF RESULTS DATA IN CHUNKS

(71) Applicant: NATIONAL INSTRUMENTS CORPORATION, Austin, TX (US)

(72) Inventor: James A. Grey, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 497 days.

(21) Appl. No.: 13/965,462

(22) Filed: Aug. 13, 2013

(65) Prior Publication Data

US 2014/0006860 A1 Jan. 2, 2014

Related U.S. Application Data

(63) Continuation of application No. 13/930,265, filed on Jun. 28, 2013.

(60) Provisional application No. 61/666,041, filed on Jun. 29, 2012.

(51) Int. Cl.
G06F 11/00 (2006.01)
G06F 11/22 (2006.01)
G06F 11/263 (2006.01)
G01R 31/3183 (2006.01)
G01R 31/317 (2006.01)

(52) U.S. Cl.
CPC ..... *G06F 11/2273* (2013.01); *G01R 31/31707* (2013.01); *G01R 31/318371* (2013.01); *G06F 11/263* (2013.01)

(58) Field of Classification Search
CPC ............... G06F 11/263; G06F 11/2273; G06R 31/31707; G06R 31/318371
See application file for complete search history.

(56) References Cited

U.S. PATENT DOCUMENTS

| 4,604,694 | A | * | 8/1986 | Hough | G06F 9/52 710/200 |
| 4,884,217 | A | * | 11/1989 | Skeirik | G05B 13/028 706/11 |
| 5,544,308 | A | * | 8/1996 | Giordano | G06F 11/2257 706/45 |
| 5,740,353 | A | | 4/1998 | Kreulen et al. | |
| 6,151,022 | A | * | 11/2000 | Alshibani | G06F 9/4448 704/1 |
| 6,570,385 | B1 | * | 5/2003 | Roberts | G01R 31/007 320/104 |

(Continued)

*Primary Examiner* — Bryce Bonzo
*Assistant Examiner* — Jeison C Arcos
(74) *Attorney, Agent, or Firm* — Meyertons Hood Kivlin Kowert & Goetzel, P.C.; Jeffrey C. Hood

(57) ABSTRACT

Test executive system and method of use. The system includes a test executive engine, configured to execute at least one test executive sequence to test at least one unit under test (UUT), a process model that specifies one or more function sequences for pre-test or post-test functionality for the test executive sequences, and a plug-in framework, configured to selectively incorporate one or more process model plug-in instances in the process model. Each process model plug-in instance specifies at least one respective function sequence for pre-test or post-test functionality for the test executive sequences.

19 Claims, 13 Drawing Sheets

(56) References Cited

U.S. PATENT DOCUMENTS

| | | | |
|---|---|---|---|
| 6,697,750 B1* | 2/2004 | Coin | H04B 10/07 702/106 |
| 6,738,974 B1* | 5/2004 | Nageswaran | G06F 9/52 718/102 |
| 8,225,152 B2 | 7/2012 | Sutton | |
| 2002/0124205 A1* | 9/2002 | Grey | G06F 11/3688 714/33 |
| 2002/0124241 A1* | 9/2002 | Grey | G06F 9/52 717/149 |
| 2004/0093180 A1* | 5/2004 | Grey | G06F 11/263 702/123 |
| 2004/0221238 A1* | 11/2004 | Cifra | G05B 19/0426 715/762 |
| 2005/0257086 A1* | 11/2005 | Triou, Jr. | G06F 11/3688 714/25 |

* cited by examiner

TEST EXECUTIVE SYSTEM WITH PROCESSING OF RESULTS DATA IN CHUNKS

PRIORITY INFORMATION

This application is a continuation of U.S. patent application Ser. No. 13/930,265 titled "Test Executive System With Process Model Plug-ins," filed on Jun. 28, 2013, whose inventor was James A. Grey, and which claims priority to U.S. provisional patent application No. 61/666,041 titled "Test Executive System With Process Model Plug-ins," filed on Jun. 29, 2012, whose inventor was James A. Grey.

FIELD OF THE INVENTION

The present invention relates to the field of test executive sequence software, and more particularly to a test executive system that includes plug-ins for process models.

DESCRIPTION OF THE RELATED ART

Test executive software is specialized software that allows a user to create and execute test executive (function) sequences to test units under test (UUTs). The test executive software operates as a control center for an automated test system. More specifically, the test executive software allows the user to create, configure, and control execution of test executive sequences for various test applications, such as production and manufacturing test applications. Text executive software typically includes various features such as test sequencing based on pass/fail results, logging of test results, and test report generation, among others.

A test executive sequence may include a plurality of steps, and one or more of the steps may call user-supplied code modules, also referred to herein as test modules. As used herein, a user-supplied code module or test module refers to a software module that is written or supplied by a user of the test executive software. The user may construct various test modules designed to perform tests on a UUT, and execution of these test modules may be invoked by steps in a test executive sequence when the sequence is executed. For example, the test modules may interact with one or more hardware instruments to test the UUT(s). Moreover, pre-defined test modules and sequences may be provided to users, which may be configured or edited by the users as needed.

The test executive software typically includes a sequence editor for creating test executive sequences and a test executive engine operable to execute the test executive sequences. Executing a test executive sequence may comprise executing each of the steps in the test executive sequence, e.g., executing each of the steps according to an order defined by the test executive sequence.

For each step in the test executive sequence that calls a user-supplied code module, executing the step may comprise both executing program instructions of the test executive engine and executing the user-supplied code module. For example, in addition to calling a user-supplied code module, a step in a test executive sequence may also perform additional functionality, where the additional functionality is implemented by the test executive engine and not coded by the user. For example, the step may be operable to perform common functionality which is useful for various automated test applications, where the common functionality is implemented by the test executive engine. This may remove the burden on the user from implementing this functionality for the step, thus increasing the user's ease and efficiency of creating the automated test system.

As one example, the test executive engine may implement automatic result collection for a step in a test executive sequence. For example, when the step is executed during execution of the test executive sequence, the test executive engine may first invoke execution of a user-supplied code module called by the step. The user-supplied code module may execute to perform a specific test of a UUT. The user-supplied code module may conform to a programming interface through which its execution results can be passed back to the test executive engine. When the user-supplied code module finishes execution, the test executive engine may be operable to automatically receive the execution results of the module and log them in a report file or database. Thus, in this example, the user may implement the specific test functionality performed by the user-supplied code module but may not be required to implement the functionality of logging the execution results of the user-supplied code module since the logging is performed automatically by the test executive engine.

In some cases a test executive sequence may also include one or more steps that do not call user-supplied code modules. For example, the functionality of some steps may be implemented entirely by the test executive engine and may not be coded by the user. However, the test executive software, e.g., the sequence editor, may allow the user to set various properties or parameters affecting operation of the steps, e.g., by interacting with a dialog box or other graphical user interface associated with the steps.

Thus, testing a UUT typically requires more than just executing a set of tests. Usually, the test system must perform a series of operations before and after it executes the sequence that performs the tests. Common operations include identifying the UUT, notifying the operator of pass/fail status, logging results, and generating a test report. These operations, which define the testing process, and their flow of execution may be included in a process model. This process model based architecture substantially distinguishes from both commercial and "home-grown" monolithic test executive systems.

For example, without a process model, each test sequence would need to provide the mechanism for these common tasks. This code would have to be repeated in each new test sequence created. Any changes to the operation of these common tasks would need to be repeated in each test sequence. Using a process model, one has increased modularity and reusability by keeping all of the code that performs common tasks. Any modifications to the common operations need to be changed in only one common location.

There are several advantages to this process model architecture. For example, one can use a single process model with several different test sequences, which minimizes development effort and improves maintainability in the future. An additional advantage is that you can run a single test sequence within several process models, which results in increased flexibility when running in different environments. The same test sequence can be used for validation and verification tasks during development and be passed onto the factory floor to test UUTs in a different process model. Thus the test process can change but the tests executed remain the same.

Various process models can be used and even modified, e.g., a sequential model, a batch model, and a parallel model. The sequential model can be used to run a test sequence on one UUT at a time. Using the parallel and batch models, one can run the same test sequence on multiple UUTs at the same time. Each process model may provide a different test experience without requiring any modifications to the client sequence file.

FIGS. 1A and 1B illustrates exemplary parallel and batch process models, respectively. As may be seen, in each of these cases, the process model provides various pre- and post-testing functions or operations, including, for example, entry of UUT serial numbers, synchronization of instruments, initiation of the testing process, report generation, and so forth, with specific tests (test sequences) invoked and performed in the context of these operations.

Monolithic test executives often implement their process model internally and do not allow users to modify them. The use of separate and distinct process models provides a mechanism for defining new process models or customizing existing ones. Process models are generally represented as a sequence file that contains three special types of sequences with which users can customize behavior. The user can edit a process model in the same way that sequence files are edited to create customized behavior. By representing a process model as a sequence, it becomes simple to edit and extremely flexible. Changes can be made in any language and any arbitrary code can be added. For example, the user can modify the process model by opening it in the sequence editor and adding steps the same way one creates client sequence files.

One type of special sequence in a process model is a model callback. Model callbacks are sequences that are typically executed inside of a process model, but client sequences can override the default behavior. When a callback is overridden, rather than calling the code inside of the process model sequence, code is executed in the client sequence. With this feature one can implement unique behavior for a particular test sequence without impacting other parts of the process model. For example, for one particular type of UUT, a user may want to use a bar code scanner rather than the manual serial number entry. Other examples of a model callback are the process setup and process cleanup sequences. When testing a large batch of UUTs, it may make sense to initialize and clean up a set of instruments a single time rather than initializing and cleaning up before and after every UUT. Overriding the process setup and process cleanup callbacks in a client sequence is an effective way to add functionality to the testing process without impacting other common tasks in the process model. Callbacks increase modularity of code but allow maximum flexibility for customized behavior.

Another special type of sequence in a process model is an execution entry point. Execution entry points in a process model offer different modes of execution that lead to different testing procedures. Examples of entry points include, but are not limited to, "test UUTs" and "single pass", where, for example, the test UUTs execution entry point executes in a loop that repeatedly identifies and tests UUTs, and the single pass execution entry point tests a single UUT without identifying it. Execution entry points can be configured for restricted user access. For example, operators may run only the test UUTs execution entry point, but technicians may run both the test UUTs and single pass execution entry points. Users can customize the process model to create their own entry points for other purposes, such as debugging, and so a sequence editor may automatically add additional entry points to the appropriate menu. Operator interfaces can accommodate the addition of execution entry points without changing any code. This modular architecture improves flexibility and maintainability by reducing the amount of recoding when changes are made to the process model.

Another special type of sequence in a process model is a configuration entry point. With configuration entry points, an operator can set various configuration options for the process model, such as configure report options and configure database options. Like the other parts of the process model, configuration entry points are fully customizable. Existing entry points can be customized for additional options and new configuration entry points can be added to add different options. Using configuration entry points, a station can be configured in several different ways without changing code. For example, one test station can be used to diagnose problems and may not need to use database logging. By using the configure database options configuration entry point, this station can be configured to disable database logging without the need for recoding the process model. Similar to the execution entry points, configuration entry points are automatically added as menu items when they are created. No code needs to be rewritten in operator interfaces to add these options.

However, the above approach still requires significant effort by users to specify or otherwise customize testing behaviors, including specifying and customizing process models.

Accordingly, improved systems and methods for testing units under test are desired.

SUMMARY OF THE INVENTION

Various embodiments of a system and method for creating a test executive sequence are described. The test executive sequence may include a first plurality of steps to be performed by a test executive engine to test a unit under test (UUT). The test executive sequence may be configured with a process model which includes a second plurality of steps to be performed by the test executive engine before and/or after executing the first plurality of steps. The process model may be configured to accept process model plug-ins that define or specify the second plurality of steps. Configuring the test executive sequence with the process model may include selecting one or more process model plug-ins for the process model. Each process model plug-in may include two or more of the second plurality of steps.

Prior to selecting the one or more process model plug-ins, each of the process model plug-ins may be created in response to user input. Creating each respective process model plug-in may include receiving user input selecting each of the steps to be included in the process model plug-in, e.g., via a sequence editor or other graphical user interface. Each respective process model plug-in may be created by creating a respective process model plug-in file and storing information defining the steps of the respective process model plug-in in the respective process model plug-in file. The steps for a given process model plug-in may be read from its process model plug-in file when the process model plug-in is used in a test executive sequence.

In some embodiments the process model may include a plurality of entry points. Each of the one or more process model plug-ins may be associated with a respective one of the entry points.

The first plurality of steps of the test executive sequence may be designed to execute particular tests on the UUT. In various embodiments the process model plug-ins may be configured to perform any of various kinds of functionality before and/or after the execution of the first plurality of steps. For example, in one embodiment a given process model plug-in may include two or more steps configured to receive test results generated by the first plurality of steps when testing the UUT and generate a report indicating the test results. As another example, in another embodiment a given process model plug-in may include two or more steps configured to receive test results generated by the first plurality of steps when testing the UUT and log the test results in one or more of a file or database.

BRIEF DESCRIPTION OF THE DRAWINGS

A better understanding of the present invention can be obtained when the following detailed description of the preferred embodiment is considered in conjunction with the following drawings, in which.

Figure 1A:
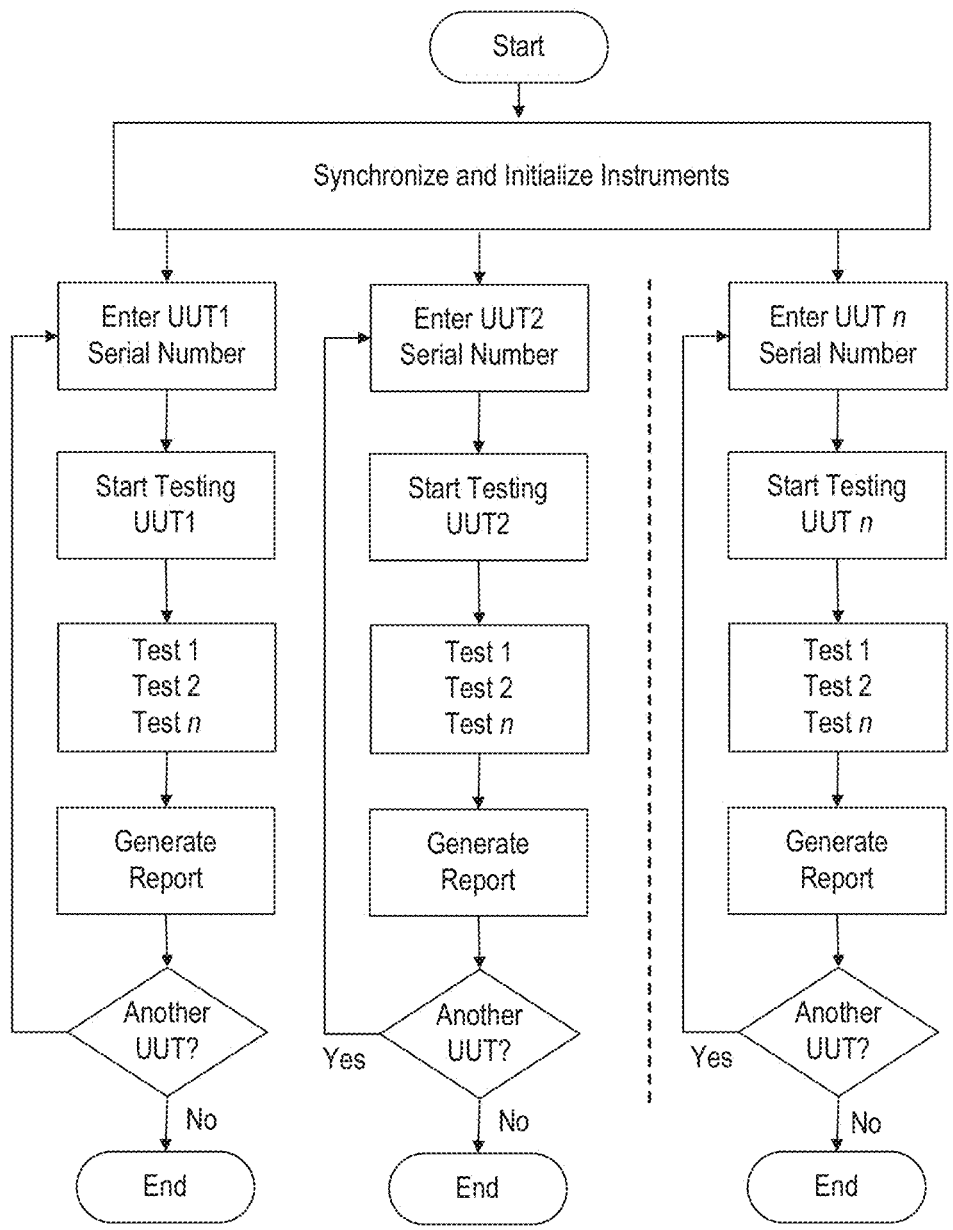
FIGS. 1A and 1B illustrates exemplary test executive sequence process models, according to the prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following references are hereby incorporated by reference in their entirety as though fully and completely set forth herein:

U.S. Pat. No. 6,401,220 titled "Test Executive System and Method Including Step Types for Improved Configurability," issued Jun. 4, 2002.

U.S. patent application Ser. No. 09/944,546 titled "System and Method Enabling Execution Stop and Restart of a Test Executive Sequence(s)," filed Aug. 31, 2001.

U.S. patent application Ser. No. 10/056,853 titled "Test Executive System Having XML Reporting Capabilities," filed Jan. 25, 2002.

Terms

The following is a glossary of terms used in the present application:

User-Supplied Code Module—A software module or component written by a user. A user-supplied code module may be constructed or packaged in any of various ways and may be created using any of various programming tools or application development environments. For example, a user-supplied code module may be implemented as a function in a Windows Dynamic Link Library (DLL), a LabVIEW graphical program (VI), an ActiveX component, a Java component, or other type of program module or component that implements a specific test or other functionality.

Test Module—A user-supplied code module that performs a test of a UUT.

Test Executive Step—An action that the user can include within a test executive sequence. A step may call a user-supplied code module, e.g., may call a test module to perform a specific test of a UUT. The step may have properties or parameters that can be set by the user, e.g., through a dialog box or other graphical user interface. In addition to calling a user-supplied code module, a step may also have built-in functionality implemented by the test executive software.

Step Module—The user-supplied code module that a test executive step calls.

Test Executive Sequence—A plurality of test executive steps that the user specifies for execution on a unit under test in a particular order. Whether and when a step is executed can depend on the results of previous steps. A test executive sequence may be created using a sequence editor. For example, the sequence editor may create a sequence file or other data structure representing the test executive sequence. A test executive sequence may be executed by a test executive engine.

Process Model—A set of steps performed before and/or after the execution of a test executive sequence. The process model defines the flow of execution of the test process and determines what actions to take before and after the test executive sequence executes.

Process Model Plug-in—A subset of the steps in a process model. A process model plug-in is invoked at a particular point during the execution of the process model.

Sequence Editor—A program that provides a graphical user interface for creating, editing, and debugging sequences. One embodiment of a sequence editor is described in detail below.

Test Executive Engine—A program operable to execute a test executive sequence. One embodiment of a test executive engine is described in detail below.

Run-time Operator Interface Application—An application program that provides a graphical user interface for controlling execution of test executive sequences, e.g., on a production station. For example, the graphical user interface of the run-time operator interface application may allow a test operator to start and stop execution of the test executive sequences. A sequence editor and run-time operator interface application can be separate programs or different aspects of the same program. The test executive engine may provide an application programming interface (API) which the run-time operator interface application calls to control execution of the test executive sequences.

Application Development Environment (ADE)—A programming environment such as LabVIEW, LabWindows/CVI, Microsoft Visual C++, Microsoft Visual Basic, etc., in which a user can create user-supplied code modules and run-time operator interface applications.

Unit Under Test (UUT)—A physical device or component that is being tested.

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Figure 2A:
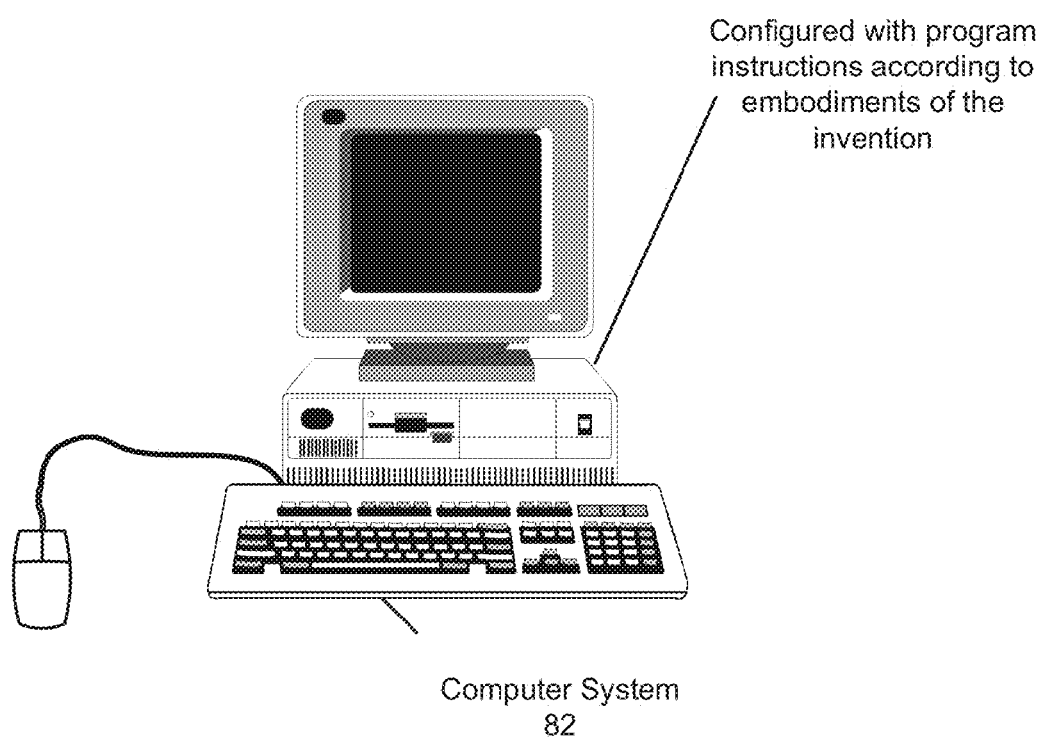
FIG. 2A illustrates a computer system configured to execute an embodiment of the present invention.

FIG. 2A—Computer System

FIG. 2A illustrates a computer system 82 configured to implement embodiments of the present invention.

The computer 822 may be configured to execute a test executive sequence operable to analyze, measure, control, or otherwise test a unit under test (UUT) or process. For example, the test executive sequence may include various steps that invoke software test modules operable to connect through the one or more instruments to analyze, measure, or control the unit under test (UUT) or process The software test modules that are invoked or called by the steps in the test executive sequence may comprise user-supplied code modules. In other words, the test modules may be written or supplied by a user of the test executive software. The test executive software may include a test executive engine 220 operable to execute the test executive sequence.

As shown in FIG. 2A, the computer system 82 may include a display device configured to display the test executive sequence as it is created and/or executed, and/or to display results of the execution. The display device may also be configured to display a graphical user interface during execution of the test executive sequence. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more programs which are executable to perform the methods described herein. Additionally, the memory medium may store a development environment application used to create and/or execute text executive sequences and related elements, such as process model plug-ins, described below in detail. The memory medium may also store operating system software, as well as other software for operation of the computer system. Various embodiments further include receiving or storing instructions and/or data implemented in accordance with the foregoing description upon a carrier medium.

Figure 2B:
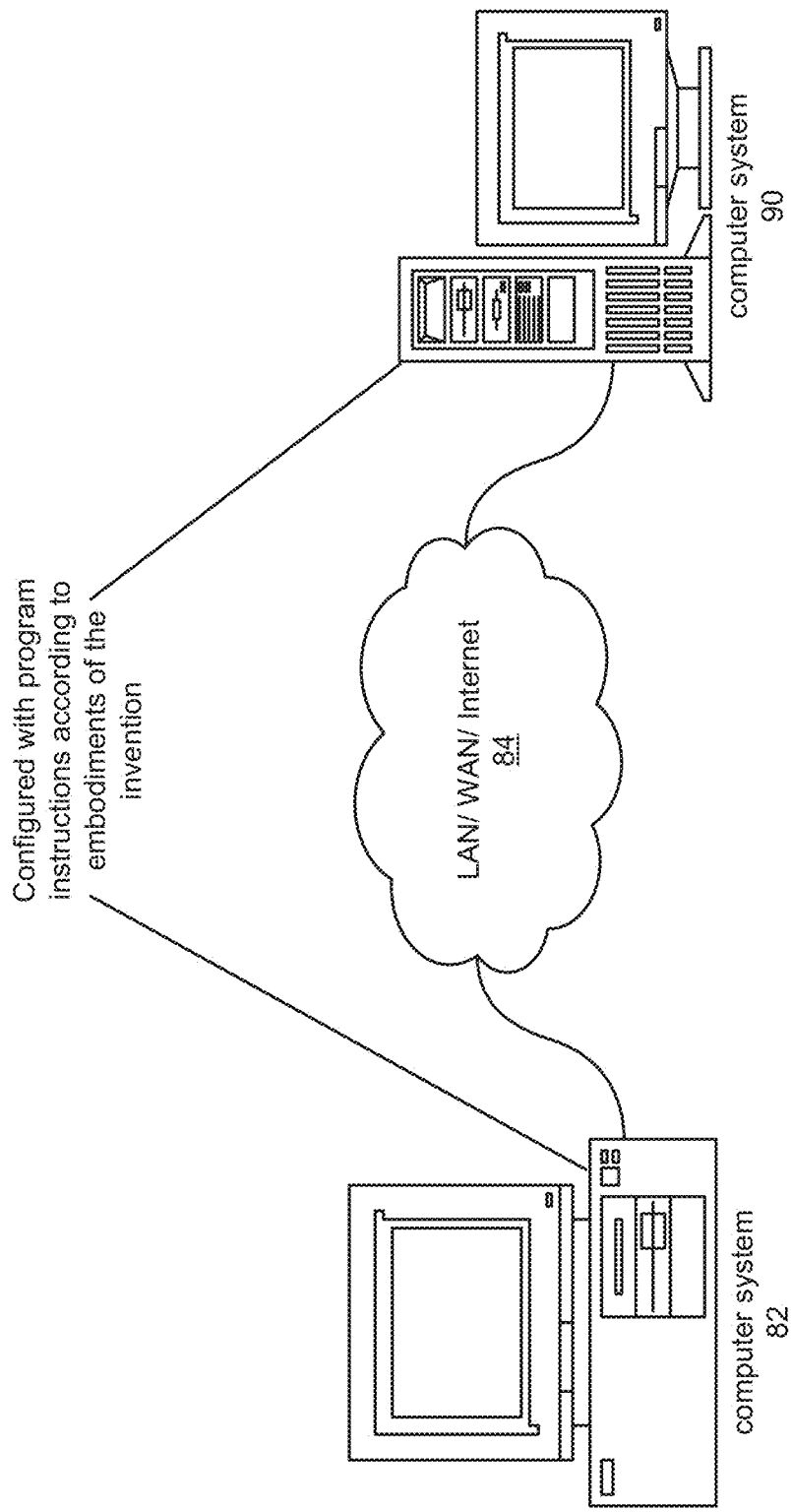
FIG. 2B illustrates a network system comprising two or more computer systems that may implement an embodiment of the present invention.

FIG. 2B—Computer Network

FIG. 2B illustrates a system configured to implement embodiments of the present invention, including a first computer system 82 that is coupled to a second computer system 90. The computer system 82 may be coupled via a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a graphical program, such as a test executive sequence, in a distributed fashion. For example, computer 82 may execute a first portion of the test executive sequence and computer system 90 may execute a second portion of the test executive sequence. As another example, computer 82 may display the graphical user interface of a test executive sequence system and computer system 90 may execute the test executive sequence.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

FIG. 2A illustrates an exemplary instrumentation control system 100 which may implement embodiments of the invention. The system 100 comprises a host computer 82 which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

FIG. 2B illustrates an exemplary industrial automation system 160 which may implement embodiments of the invention. The industrial automation system 160 is similar to the instrumentation or test and measurement system 100 shown in FIG. 2A. Elements which are similar or identical to elements in FIG. 2A have the same reference numerals for convenience. The system 160 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

Figure 3A:
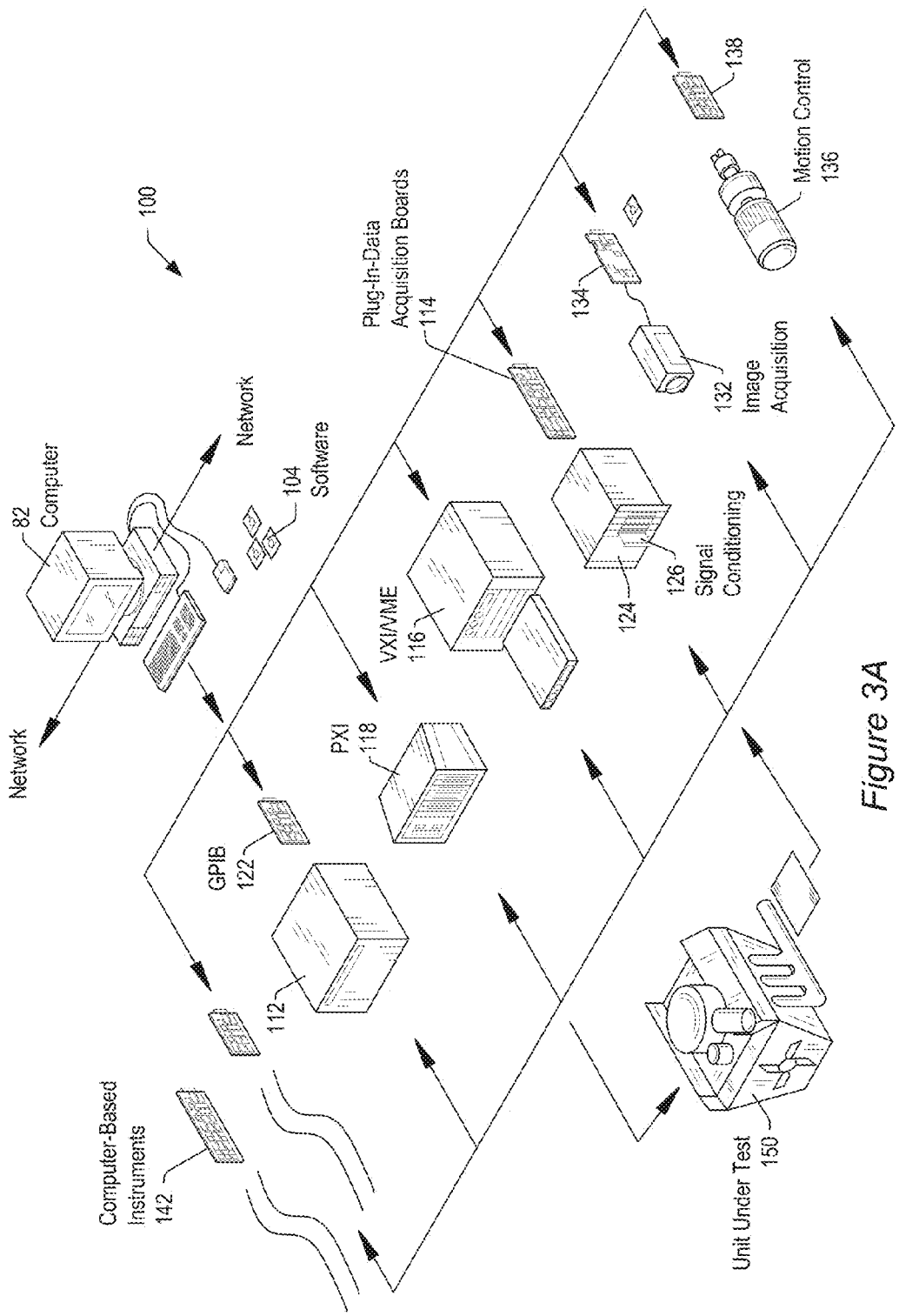
FIG. 3A illustrates an instrumentation control system according to one embodiment of the invention.
Figure 3B:
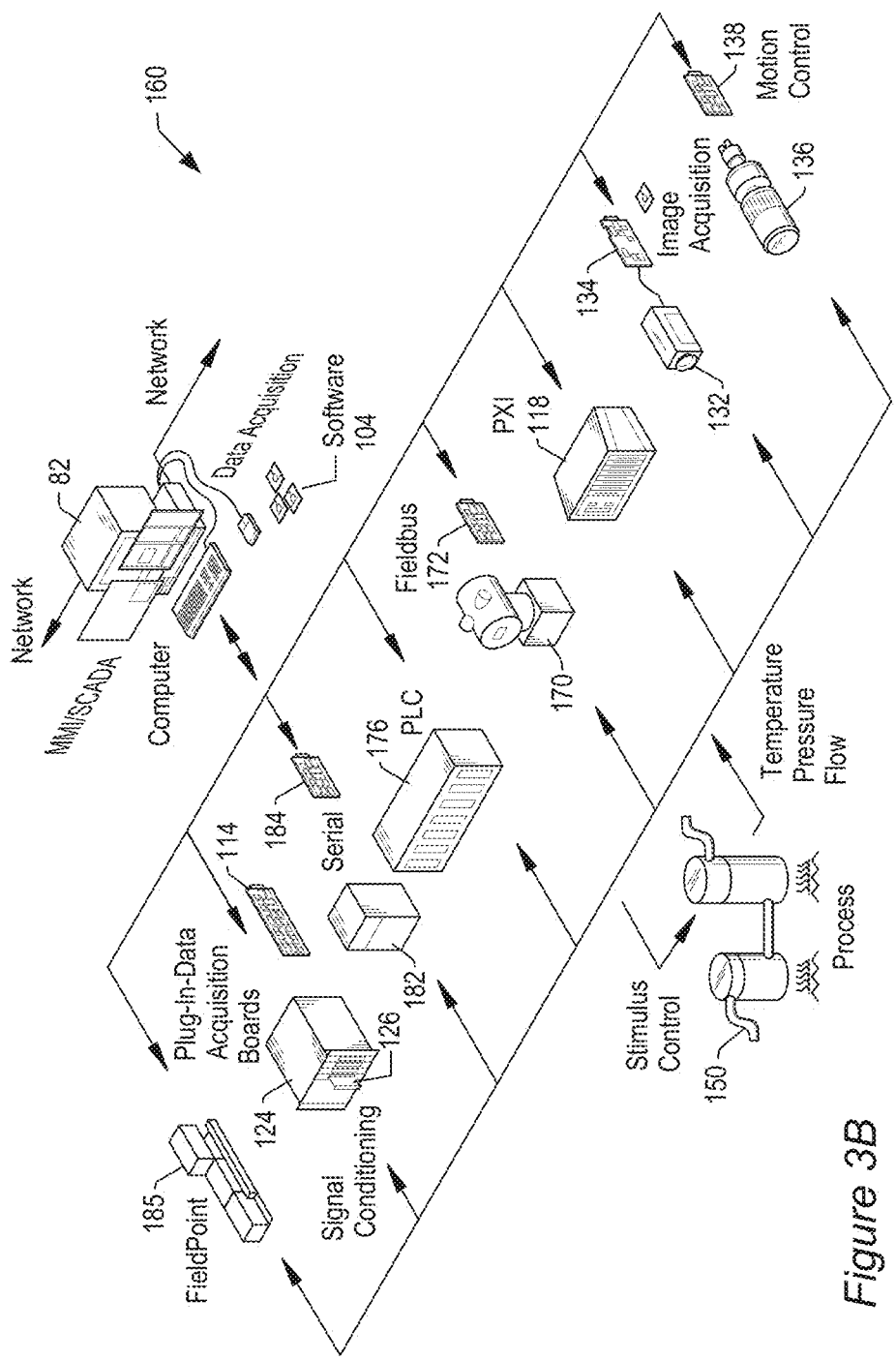
FIG. 3B illustrates an industrial automation system according to one embodiment of the invention.

In the embodiments of FIGS. 3A and 3B above, one or more of the various devices may couple to each other over a network, such as the Internet. In one embodiment, the user operates to select a target device from a plurality of possible target devices for programming or configuration using a graphical program. Thus the user may create a graphical program on a computer and use (execute) the graphical program on that computer or deploy the graphical program to a target device (for remote execution on the target device) that is remotely located from the computer and coupled to the computer through a network.

Graphical software programs which perform data acquisition, analysis and/or presentation, e.g., for measurement, instrumentation control, industrial automation, modeling, or simulation, such as in the applications shown in FIGS. 3A and 3B, may be referred to as virtual instruments.

Figure 4:
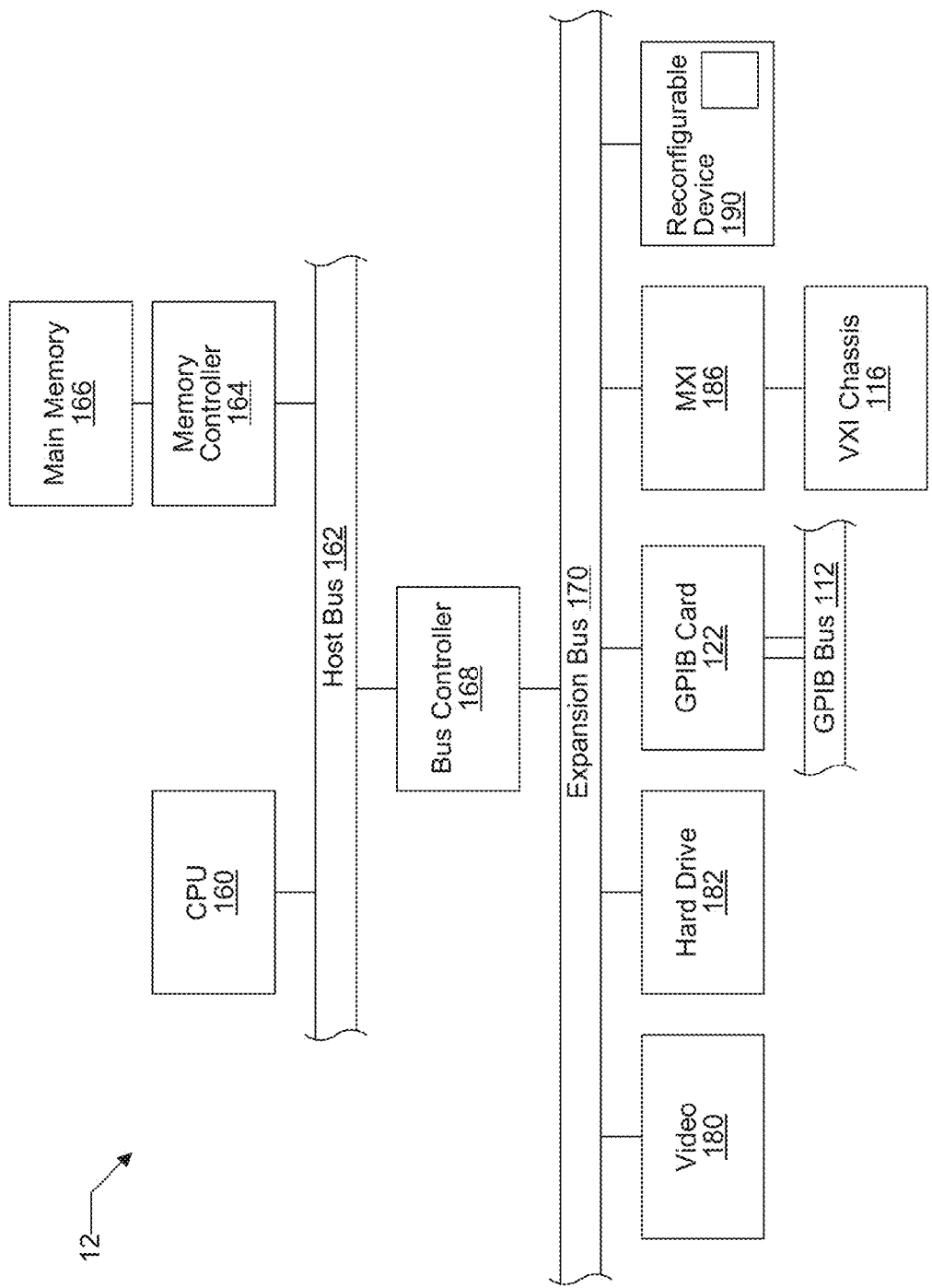
FIG. 4 is an exemplary block diagram of the computer systems of FIGS. 2A, 2B, 3A, and 3B.

FIG. 4—Computer System Block Diagram

Figure 1B:
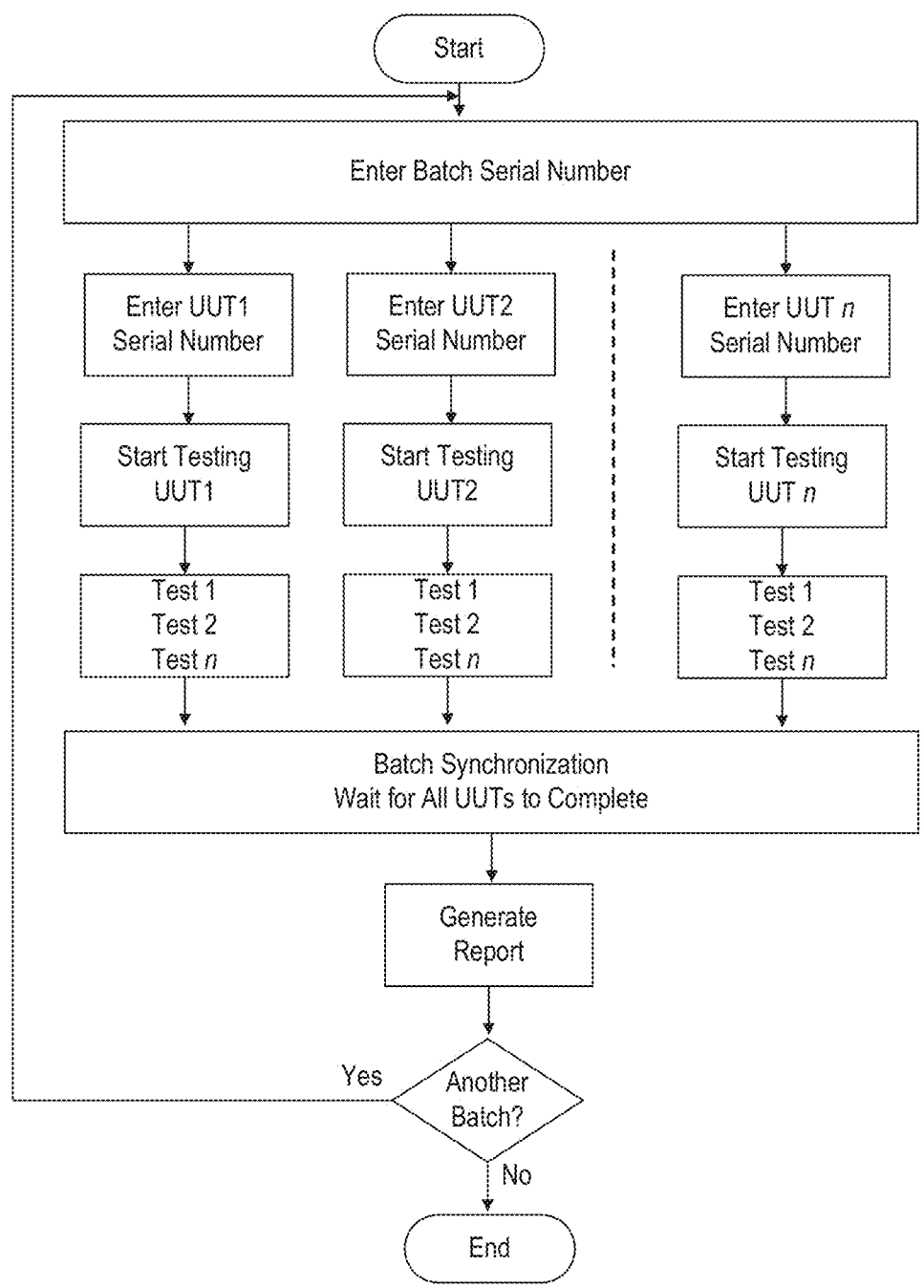

FIG. 4 is a block diagram representing one embodiment of the computer system 82 and/or 90 illustrated in FIGS. 1A and 1B, or computer system 82 shown in FIG. 2A or 2B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store test executive sequence software, e.g., test executive sequences, process models, a test executive engine, and/or a test executive sequence application development environment, among others. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a real time operating system. The device 190 may also or instead comprise a programmable hardware element. The computer system may be configured to deploy a test executive sequence to the device 190 for execution on the device 190. The deployed sequence may take the form of graphical program instructions or data structures that directly represents the sequence. Alternatively, the deployed sequence may take the form of text code (e.g., C code) generated from the sequence. As another example, the deployed sequence may take the form of compiled code generated from either the sequence or from text code that in turn was generated from the sequence.

Process Model Plug-Ins

In some embodiments, a test executive system may be provided (e.g., for deployment to and execution on a computer system) that includes a test executive engine, configured to execute at least one test executive sequence to test at least one unit under test (UUT), and a process model, where the process model specifies one or more function sequences for pre-test or post-test functionality.

The test executive system may also include a plug-in framework, which may be configured to selectively incorporate one or more process model plug-in instances in the process model. Each process model plug-in may include or specify at least one respective function sequence for pre-test or post-test functionality. Note that for brevity the process model plug-ins may be referred to herein simply as "plug-ins".

Each plug-in may thus include or specify one or more function sequences that the test executive engine (or simply "engine" for brevity) may call during process model execution to accomplish various tasks, e.g., results processing tasks, such as report generation and database logging tasks. The test executive system may include one or more built-in plug-ins, e.g., a Reports Generation plug-in to handle report generation, a Database Logging plug-in to handle database logging, and/or an Offline Results Generation plug-in for raw result logging, also referred to as offline results generation. Moreover, in some embodiments, a user may create custom process model plug-ins to extend or modify the functionality of the process model(s) without changing the process model files directly. In some embodiments, the test executive system may further include a sequence editor, configured to include or configure a plurality of test executive steps in a test executive sequence in response to user input to the sequence editor, although this functionality is not required for the techniques disclosed herein.

An illustrative exemplary implementation of a test executive system with process model plug-ins is described herein in the context of the TestStand™ test executive system provided by National Instruments Corporation, although it should be noted that the embodiments described are not intended to limit the invention to any particular implementation, formats, feature set, names, directories, or appearance.

Figure 5:
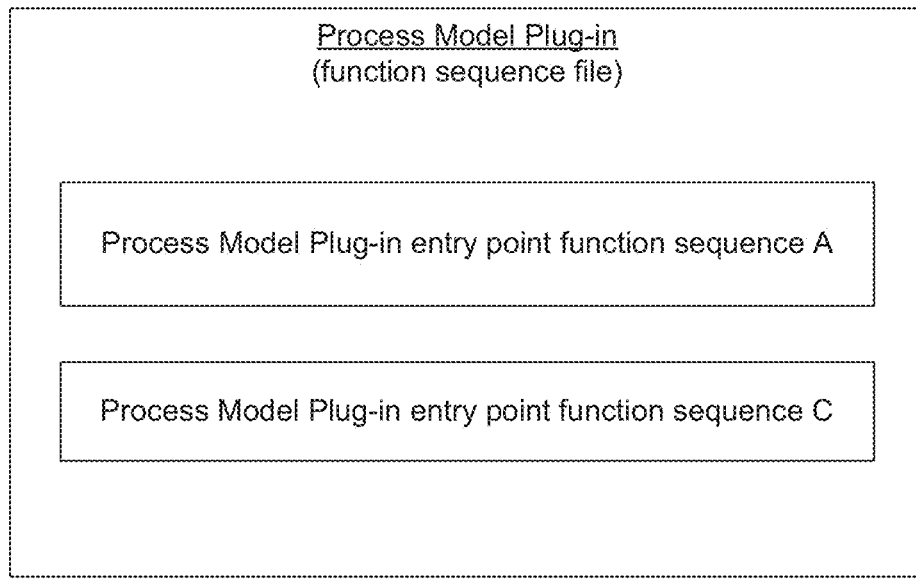
FIG. 5 is a high-level block diagram of an exemplary process model plug-in and associated instance, according to one embodiment.
Figure 5:
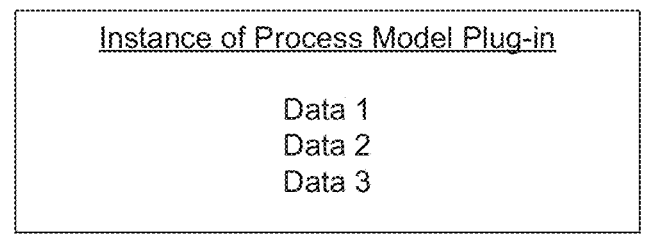

FIG. 5—Exemplary Structure of Process Model Plug-Ins

FIG. 5 is a high-level block diagram of an exemplary process model plug-in and associated instance, according to one embodiment. In some embodiments, process model plug-ins may be implemented in terms of specific entry points, entry point parameters, and/or data types. As used herein, the term "entry points" refers to a specified (possibly abstract) set of interfaces corresponding to specific points in the process model execution, where process model plug-ins can provide implementations for one or more of the interfaces in the form of respective function sequences, which may themselves be referred to as (implemented) entry points (or entry point function sequences). In other words, there are various points in process model execution where process model functionality can be specified by users via corresponding function sequences, i.e., entry point function sequences, or simply "entry points".

As may be seen in FIG. 5, the exemplary process model plug-in (or function sequence file) shown includes a process model plug-in entry point function sequence A, which may correspond to an execution point A in the process model, as well as a process model plug-in entry point function sequence C, which may correspond to an execution point C in the process model, discussed in more detail below with reference to FIG. 6. As FIG. 5 also shows, an instance of the process model plug-in include data elements or structures for the plug-in, specifically, data 1, data 2, and data 3.

Entry point parameters may be passed to an invoked plug-in function sequence, and may include various attributes of the plug-in itself, such as, for example, ModelPlugin, which is used to pass an instance of the plug-in to an invoked plug-in, and thus includes the data elements for the associated function sequence(s), e.g., data 1, data 2, and/or data 3, as well as additional data arguments passed to the function sequence(s) for execution, e.g., ModelPluginConfiguration, ModelThreadType, ModelType, CallingThread, and so forth. The data types are the data definitions for the various parameters. Thus, in some embodiments, each plug-in is a sequence file that includes one or more function sequences, including one or more entry point function sequences. Moreover, in some embodiments, the sequence file may also include non-entry point function sequences that can be called from other sequences. Note that the name "entry point" is exemplary only, and that any other names for process model function sequences may be used as desired. More generally, it is not the particular names of elements and processes described herein that are important, but the techniques, functionality, and concepts disclosed.

In some embodiments, the plug-in instances and plug-in function sequences may be considered as somewhat analogous to the object oriented concepts of data elements and class methods of an instantiated object, respectively. In other words, the plug-in (sequence file) includes the function sequences, and the instance includes the data used by the function sequences, much as the methods of a class operate according to the data elements of an instantiated object of the class.

It should be noted that the particular implementation disclosed herein is meant to be exemplary only, and is not intended to limit the embodiments of the invention to any particular form, function, or appearance. For example, in some embodiments, object oriented concepts and mechanisms may be used, possibly including inheritance.

Thus, by setting the values for the data fields of an instance, a user may specify the particular behavior of the instance of the plug-in. Accordingly, multiple instances of a plug-in may be invoked, possibly within the same model execution, where each instance operates per its internal data and per the other parameters passed in. Configuration of plug-ins and plug-in instances are discussed below in more detail.

Exemplary Plug-In Entry Points

In some embodiments, process models may invoke model plug-ins (or instances) by calling one or more optional entry point function sequences with a pre-defined set of parameters at specific points in the testing process.

Figure 6:
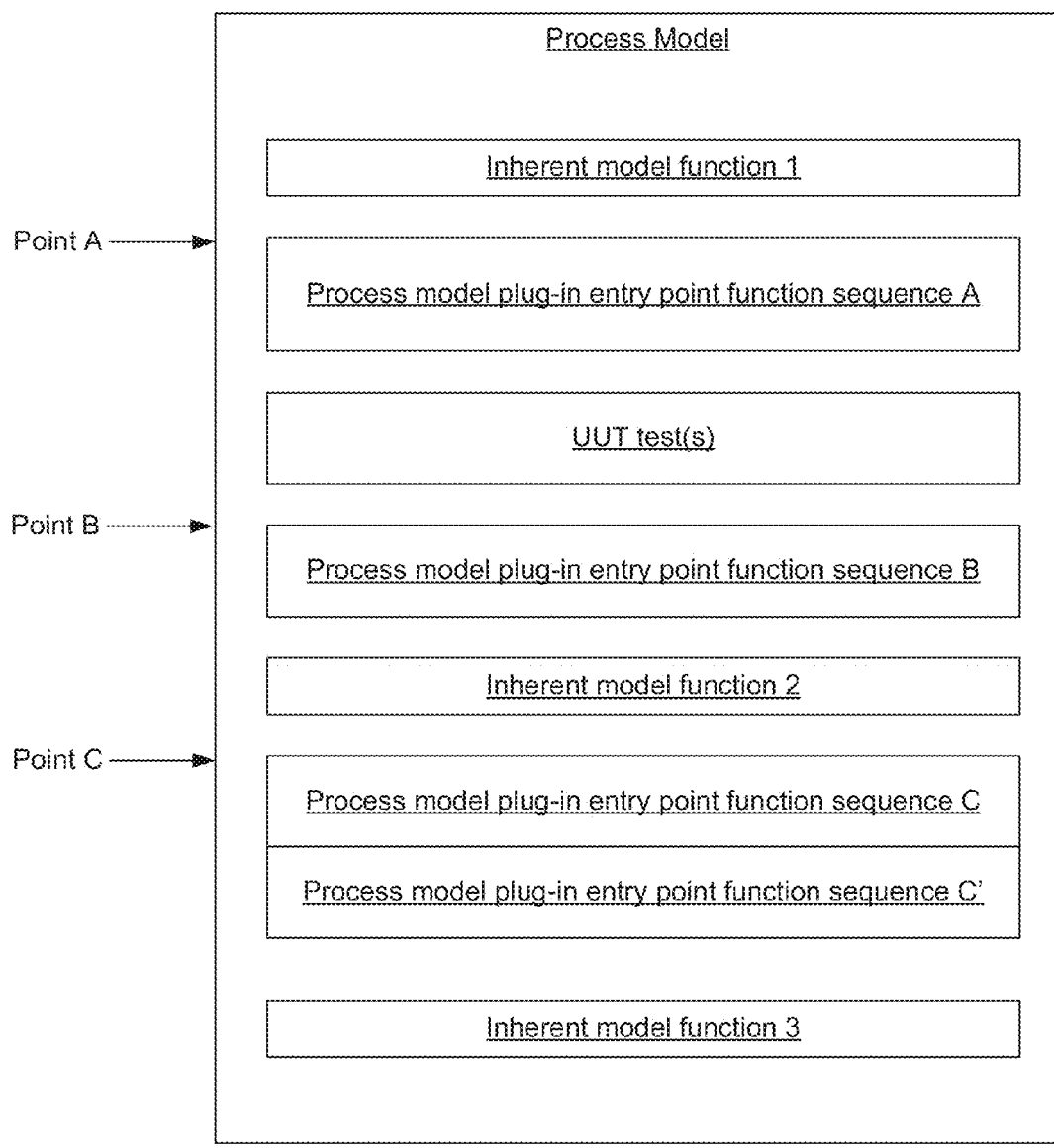
FIG. 6 is a high-level block diagram of an exemplary test executive system process model with process model plug-ins, according to one embodiment.

FIG. 6 is a high-level block diagram of an exemplary (and simplified) test executive system process model with process model plug-ins, according to one embodiment. As shown, in this illustrative embodiment, the process model includes several inherent functions, specifically, inherent model function 1, inherent model function 2, and inherent model function 3, as well as one or more UUT tests, as indicated. As also shown, the process model has a set of pre-defined (execution) points, A, B, and C, at each of which one or more process model plug-ins may invoked with particular instances. In this exemplary embodiment, after performance of inherent model function 1, at point A, a process model plug-in entry point function sequence A is invoked. Then the one or more UUT tests are performed, after which, at point B, process model plug-in entry point B is invoked. Then, inherent model function 2 is performed. Subsequently, at point C, a process model plug-in entry point function sequence C is invoked, then a process model plug-in entry point function sequence C' is invoked, where the "prime" simply denotes that the second process model plug-in entry point function sequence invoked at point C is from a different plug-in. In other words, two different process model plug-ins included an entry point function sequence for point C. In some embodiments the process model plug-in entry point function sequences A and C may be provided by the exemplary plug-in of FIG. 5, and the process model plug-in entry point function sequences B and C' may be provided by one or more different plug-ins.

The following is an example of a set of entry points, where each entry point name includes "Model Plugin" to denote its identity as a model plug-in entry point function sequence. It should be noted that the particular names used herein are exemplary only, and that any other names (and functions) may be used as desired.

Model Plugin—Configure Standard Options
    Model Plugin—Configure Additional Options
    Model Plugin—Initialize
    Model Plugin—Begin
    Model Plugin—Pre Batch
    Model Plugin—Pre UUT
    Model Plugin—Batch Start
    Model Plugin—UUT Start
    Model Plugin—OnTheFly Step Results
    Model Plugin—UUT Done
    Model Plugin—Batch Done
    Model Plugin—Post UUT
    Model Plugin—Post Batch
    Model Plugin—End Note that each plug-in may implement some subset of the defined entry points as desired. In other words, only the entry points needed to perform specific tasks may be implemented by a particular plug-in. It should be further noted that the above entry points are meant to be exemplary only. Brief descriptions of the above exemplary entry points are provided below.

Following the above example, the Configure Standard Options and the Configure Additional Options entry points may provide functionality invoked when editing a model plug-in configuration. Process models may invoke (any of) the remaining entry points at run time from specified points in the model execution.

Table 1 presents an exemplary plug-in entry point run-time order for a sequential process model, where, per the above convention, each plug-in entry point (function sequence) has the "Model Plugin—" prefix:

TABLE 1

Plug-in Entry Point Run-Time Order - Sequential Model

Sequential Model Controller/Socket Thread

Model Plugin - Initialize
ModelOptions Callback
Model Plugin - Begin

TABLE 1-continued

Plug-in Entry Point Run-Time Order - Sequential Model

Sequential Model Controller/Socket Thread

Process Setup
PreUUTLoop Callback
[Begin UUT Loop]
PreUUT Callback
Model Plugin - Pre UUT
If (!continue Testing) goto [End of UUT Loop]
Model Plugin - UUT Start
MainSequence Callback
Model Plugin - OnTheFly Step ResultsModel
Plugin - UUT Done
Model Plugin - Post UUT
PostUUT Callback
[End of UUT Loop]
PostUUTLoop Callback
Process Cleanup Callback
Model Plugin - End Similarly, Table 2 presents an exemplary plug-in entry point run-time order for a parallel process model, where, as with Table 1, each plug-in entry point (function sequence) has the "Model Plugin—" prefix:

TABLE 2

Plug-in Entry Point Run-Time Order - Parallel Model

| Controller Thread | Test Sockets Threads |
|---|---|
| Model Plugin - Initialize | |
| ModelOptions Callback | |
| Model Plugin - Begin | |
| Process Setup | |
| | Model Plugin - Begin |
| | PreUUTLoop Callback |
| | [Begin UUT Loop] |
| | PreUUT Callback |
| | Model Plugin - Pre UUT |
| | If (!continue Testing) goto [End of UUT Loop] |
| | Model Plugin - UUT Start |
| | MainSequence Callback |
| | Model Plugin - OnTheFly Step Results |
| | Model Plugin - UUT Done |
| | Model Plugin - Post UUT |
| | PostUUT Callback |
| | [End of UUT Loop] |
| | PostUUTLoop Callback |
| | Model Plugin - End |
| Process Cleanup Callback | |
| Model Plugin - End | |

Table 3 presents an exemplary plug-in entry point run-time order for a batch process model, where, as with Tables 1 and 2, each plug-in entry point (function sequence) has the "Model Plugin—" prefix:

TABLE 3

Plug-in Entry Point Run-Time Order - Batch Model

| Controller Thread | Test Socket Threads |
|---|---|
| Model Plugin - Initialize | |
| ModelOptions Callback | |
| Model Plugin - Begin | |
| Process Setup | |
| PreBatchLoop Callback | |
| | Model Plugin - Begin |
| | PreUUTLoop Callback |
| [Begin Batch Loop] | |
| PreBatch Callback | |
| Model Plugin - Pre Batch | |

TABLE 3-continued

Plug-in Entry Point Run-Time Order - Batch Model

| Controller Thread | Test Socket Threads |
|---|---|
| If (!continueTesting) goto [End of Batch Loop] | |
| Model Plugin - Batch Start | [Begin UUT Loop] |
| | PreUUT Callback |
| | Model Plugin - Pre UUT |
| | If (!continueTesting) goto [End of UUT Loop] |
| | Model Plugin - UUT Start |
| | MainSequence Callback |
| | Model Plugin - OnTheFly Step Results |
| Model Plugin - Batch Done | Model Plugin - UUT Done |
| | Model Plugin - Post UUT |
| | PostUUT Callback |
| Model Plugin - Post Batch | |
| PostBatch Callback | |
| [End of Batch Loop] | [End of UUT Loop] |
| | PostUUTLoop Callback |
| | Model Plugin - End |
| PostBatchLoop Callback | |
| Process Cleanup Callback | |
| Model Plugin - End | |

As shown, in each of the above cases, particular entry points (entry point function sequences) are invoked at the indicated points during model execution.

Brief Descriptions of Exemplary Entry Points

As noted above, the exemplary Model Plugin—Configure Standard Options and Model Plugin—Configure Additional Options entry points may provide configuration functionality invoked when editing a model plug-in configuration.

For example, the Model Plugin—Configure Standard Options entry point may be used to provide a way to configure option settings for an instance of a plug-in. One example of a configurable option is "asynch", which may specify that an operation or function is performed in an asynchronous manner. In one exemplary embodiment, a plug-in that implements Model Plugin—Configure Standard Options may include an icon in an Options column of a Result Processing dialog box. Model plug-in end users may click the icon to invoke the Model Plugin—Configure Standard Options entry point (function sequence), which may launch a modal dialog box in which the end user can view and edit options for the instance of the plug-in.

As another example, the Model Plugin—Configure Additional Options entry point may be used to launch a second dialog box to provide a way for plug-in end users to configure option settings for the instance of a plug-in. Typically, this entry point may not be needed because options may be presented in a single dialog box by using tabs, modal popup dialog boxes, or any other organizational methods to accommodate many options. Further details regarding configuration of process model plug-ins are provided below.

The following briefly describes exemplary non-configuration related entry points:

Model Plugin—Initialize: A process model may call the Model Plugin—Initialize entry point once in its controller thread before calling any other run-time entry points and before calling overriding callbacks, e.g., ModelPluginOptions and ModelPluginConfiguration callbacks.

Typically, the Model Plugin—Initialize entry point may only be implemented (in a plug-in) if the user wants to initialize variables or options before the process model calls the ModelPluginOptions and ModelPluginConfiguration callbacks. Because these callbacks can disable or remove plug-ins, no guarantee exists that the process model calls the Model Plugin—End entry point for every plug-in that calls Model Plugin—Initialize entry point. Therefore, the Model Plugin—Begin entry point (rather than the Model Plugin—Initialize entry point) may generally be used to perform any initialization that requires cleanup in Model Plugin—End.

Model Plugin—Begin: The Model Plugin—Begin entry point may be used to perform required setup or initialization tasks, such as opening files or establishing database connections.

Model Plugin—Pre UUT: The Model Plugin—Pre UUT entry point may be used to identify the UUT or determine whether to continue testing.

Model Plugin—UUT Start: The Model Plugin—UUT Start entry point may be used to perform setup or initialization tasks before testing each UUT. For example, a plug-in might use Model Plugin—UUT Start to initialize database connections or open report files.

Model Plugin—OnTheFly Step Results: The Model Plugin—OnTheFly Step Results entry point may be used to obtain step results during test execution. As used herein, the term "on-the-fly" means "as the results are generated". Thus, for example, when the user enables the On-The-Fly Reporting option in the Report Options dialog box, the built-in reporting plug-in calls Model Plugin—OnTheFly Step Results to append results information to the report during test execution.

Model Plugin—UUT Done: The Model Plugin—UUT Done entry point may be used to perform an action after each UUT completes. For example, a plug-in might process the UUT test results and store the information in a report file or database tables.

Model Plugin—Post UUT: A process model may call the Model Plugin—Post UUT entry point after calling the Model Plugin—UUT Done entry point.

Model Plugin—End: The Model Plugin—End entry point to perform required cleanup or finalization tasks, such as closing files or database connections.

Model Plugin—Pre Batch: The Model Plugin—Pre Batch entry point may be used to identify the batch or determine whether to continue testing.

Model Plugin—Batch Start: The Model Plugin—Batch Start entry point may be used to perform setup or initialization tasks before testing each batch.

Model Plugin—Batch Done: The Model Plugin—Batch Done entry point may be used to perform an action after each batch completes. For example, a plug-in may generate a batch report that summarizes the results of all test socket threads.

Model Plugin—Post Batch: A process model may call the Model Plugin—Post Batch entry point after calling the Model Plugin—Batch Done entry point.

As noted above, an instance of a plug-in includes the data used by the plug-in function sequence(s) (e.g., entry points) to perform the plug-in functionality. These data may be implemented or organized in any of a variety of ways. In one exemplary embodiment, the instance may include a global variable (structure) that includes a base set of data elements shared by all plug-ins (or plug-in instances), and additional data elements or structures that may vary between plug-ins. One exemplary embodiment of such a global variable/structure is the data type NI_ModelPlugin, whose structure and exemplary use is now described for illustrative purposes.

NI_ModelPlugin: In one embodiment, when a user inserts an instance of a plug-in into a configuration, the process model creates the instance of the plug-in by copying the FileGlobals.ModelPluginComponentDescription.Default property of the NI_ModelPlugin data type in the plug-in sequence file. When the user edits the options for an instance of a plug-in, the user changes the values of subproperties of the NI_ModelPlugin data type instance.

Each time a function sequence is executed using a process model, the process model may load a copy of the plug-in configuration from its configuration file. For each NI_ModelPlugin data type instance in the configuration, the model may pass the instance to (or as) the ModelPlugin parameter of the entry points in the corresponding plug-in. The plug-in may then access the ModelPlugin parameter subproperties to determine the options configured.

Exemplary NI_ModelPlugin Properties

In one embodiment, the NI_ModelPlugin data type includes PluginSpecific, CategorySpecific, and Base top-level subproperties:

PlugInSpecific: The PlugInSpecific property contains subproperties that vary depending on the plug-in. The PlugInSpecific property is an unstructured container, meaning the subproperties and subproperty data types can vary regardless of the NI_ModelPlugin type definition.

When a developer creates a plug-in, the PluginSpecific property may include the following subproperties, each with a data type unique to the plug-in, as indicated in parentheses. The following corresponding data type may be edited to add subproperties to each property.

Options (<plug-in name>Options)—Subproperties may be created to store any options or settings the plug-in provides. Typically, one implements the Model Plugin—Configure Standard Options entry point to provide a way for end users to edit the options added (e.g., by the developer).

AdditionalOptions (<plug-in name>AdditionalOptions)—Subproperties may be created only if a Model Plugin—Configure Additional Options entry point is (also) defined.

RuntimeVariables (<plug-in name>RuntimeVariables)—The RuntimeVariables subproperty may be used to define variables the plug-in uses at run time. Subproperties may be created to share data within the same process model execution among the different entry points in the plug-in. The <plug-in name>RuntimeVariables data type may be required to always include the following subproperty:
    PerSocket (Array of <plug-in name>PerSocketRuntimeVariables)—At run time, the process model may resize the PerSocket array to include one element for each test socket in the test executive system. By adding properties to the <plug-in name>PerSocketRuntimeVariables data type, one can create per-socket variables that can be used to share data within the same process model execution among the different entry points in the plug-in.

In some embodiments, modifying the structure of these properties at run-time may not be supported, although in other embodiments, it may.

CategorySpecific: The CategorySpecific property may provide a location for related plugs-ins to store information common to all plug-ins within a category. The CategorySpecific property may not need to be edited unless a set of related plug-ins is being developed that store common properties to support behavior that all plug-ins in the category share. In one embodiment, the CategorySpecific property may include the following subproperties (data type indicated in parentheses):

Name (String)—Specifies the category to which the plug-in belongs. Plug-ins with the same case-insensitive name belong to the same category. Code that implements category-specific functionality can inspect this field to determine the category of the plug-in.

Settings (<company prefix>_<category name>CategorySettings)—The specific data type of category settings defines the option properties common to plug-ins in a category.

The built-in reporting, database, and offline results generation plug-ins may set the CategorySpecific.Name property to ResultProcessor and may set the data type of the CategorySpecific.Settings property to NI_ResultProcessorCategorySettings. These values may be required to be used for a plug-in to appear in the Result Processing dialog box. The test executive system may use these default values for any plug-in created from within the Result Processing dialog box.

Base: The Base property may contain subproperties that specify functionality common to all plug-ins. The process model may use the subproperties of the Base property to determine how to invoke plug-in entry points and other aspects of plug-in operation. In one embodiment, the Base property includes the following subproperties:

Enabled (Boolean)—Specifies whether the model invokes the instance of the plug-in at run time.

DisplayNameExpression (Expression)—An expression that specifies the name to display in the Result Processing dialog box to identify the instance of the plug-in, such as "<Company Name> Production Database", including the quotation marks. The value takes the form of an expression so that the default value the plug-in defines can refer to localized text, e.g., using the ResStr( ) expression function. One may edit the text in the Output Name column of the Result Processing dialog box.

NewThread (Boolean)—Specifies whether the plug-in performs some operations in a separate thread.

UseDefaultNewThreadImplementation (Boolean)—Specifies whether the process model automatically calls the Model Plugin—UUT Done and Model Plugin—Batch Done entry points in a new thread when the NewThread property is True. This property should be set to False if the plug-in provides its own implementation for processing in a new thread when the NewThread property is True.

CompleteBeforeNextUUT (Boolean)—Specifies whether the process model waits for the UUT Done thread of the plug-in to complete before calling any additional entry points for the current execution, except for the UUT Done entry points of other plug-ins. If the plug-in sets the UseDefaultNewThreadImplementation property to False, the plug-in should honor the CompleteBeforeNextUUT setting.

ProcessOnTheFly (Boolean)—Specifies whether the process model calls the Model Plugin—OnTheFly Step Results entry point.

CanProcessOfflineOnTheFlyResults (Boolean)—Indicates whether the plug-in can process an offline results file written on-the-fly. This property should be set to False for plug-ins that do not use the OnTheFly Step Results entry point or that access the Step or Context parameters within that entry point. The entry point should not access the Step or Context parameters because the test executive system does not pass any data to these parameters when processing data from an offline results file.

CanProcessOfflineResultsTree (Boolean)—Indicates whether the plug-in can process an offline results file that was not written on-the-fly. A value of True indicates that the UUT Done and Post UUT entry points completely process the results without requiring a call to the OnTheFly Step Results entry point.

OptionsDescriptionExpression (Expression)—The result of the expression evaluation is the text displayed to summarize the option settings in a configuration dialog box. The ModelPlugin prefix may be used to access the properties of the plug-in instance in the expression. For example, one may use the following expression to display the path of a plug-in-specific output directory: "My plug-in stores its output files at:"+ModelPlugin.PluginSpecific.Options.MyPluginOutputPath SequenceFileName (String)—The process model sets this property to the filename of the sequence file that implements the instance of the plug-in. The filename is relative to the enclosing ModelPlugins directory.

IconName (String)—This property may be set to the name of an icon that represents the instance of the plug-in. The leftmost column of the Result Processing dialog box may display this icon. The icon name should be a valid argument to the Engine.FindImage method.

GUID (String)—A string that uniquely identifies the instance of the plug-in.

AlwaysInitialize (Boolean)—If this property is True, the process model calls the Model Plugin—Initialize entry point and the ModelPluginOptions callback for the plug-in even when the Enabled property is False. The entry point and callback can set the Enabled property to True. This option adds overhead for a disabled plug-in instance because the process model must still load the plug-in sequence file at run time.

RequiresBatchControllerAndSocketSynchronization (Boolean)—If this property is True, the Batch process model allows the plug-in instance to perform controller and socket synchronization between the Model Plugin—Batch Start and Model Plugin—UUT Start entry points and between the Model Plugin—Batch Done and Model Plugin—UUT Done entry points. Further information regarding synchronization is provided below.

RunOrder (Number)—If the RunOrder properties of two plug-in instances are not equal, the process model invokes entry points on the plug-in with the lower RunOrder value first. The Order of Entry Point Execution at Run Time (see above) may be referred to for more information.

RuntimeVariables (NI_ModelPluginRuntimeVariables)—Variables the process model updates to control and indicate the execution state of the instance of the plug-in.

Configuring Process Model Plug-Ins

In some embodiments, the plug-in framework may include, provide, or have access to, a plurality of options, and accordingly, each plug-in may further specify one or more options (of the plurality of options) regarding the at least one function sequence. In other words, in some embodiments, each plug-in may not only specify at least one function sequence to invoke or execute, but may also specify a set of options with which to invoke the function sequence(s) of the plug-in. The set of options may be implemented as data fields whose values (which may be default values or set by a user) may initialize or populate an instance of the plug-in at runtime, and which specify at least some of the behavior of the corresponding function sequence. Plug-in options may specify any attributes desired. For example, one exemplary option for a report generating plug-in may indicate which report to generate or display. Other examples of such options include, but are not limited to, report path, and report format, e.g., HTML, XML, or Text formats. As noted above, in some embodiments, multiple instances of a plug-in may be inserted into the process model (e.g., via copying the instances into a configuration file), each with its own configuration. Thus, for example, respective instances of a report generating plug-in may be configured and inserted into the process model to produce two different versions of a report, e.g., text and XML.

As also noted above, a process model may invoke plug-in instances at defined points during execution. A plug-in instance may specify the plug-in (or sequence file) to invoke and the set of options with which to invoke the plug-in. In some embodiments, a user may specify insertion of plug-in instances into a process model and/or configure such instances via a dialog box (or other user interface), which in some embodiments may be category specific, as discussed in more detail below. One example of a broad plug-in category is "Results Processor", although it should be noted that other categories may be defined and utilized as desired. Plug-ins in the "Results Processor" category may relate to the processing of results of the testing process, and may utilize a corresponding configuration file ResultProcessing.cfg, which may store the information for plug-in instances configured via a Result Processing dialog box.

As mentioned above, in some embodiments, a user interface (UI), e.g., a configuration UI, may be provided for each category of plug-in, although other approaches may be used as desired, e.g., a UI may be provided per plug-in. The UI (e.g., a graphical user interface, such as a dialog box, or a command line) may allow a user to select a plug-in to instantiate and configure (via user input), in response to which a corresponding instance may be generated and inserted into an appropriate configuration file. In one embodiment with category specific UIs, the UI may only allow the user to select or configure plug-ins of the associated category. In a further embodiment, each plug-in may have an associated configuration UI that is accessible (e.g., invocable) from the configuration UI for the category. Exemplary UIs are described below with reference to FIGS. 7A-7F.

In some embodiments, user-created or specified plug-ins may also be supported, referred to herein as process model plug-in add-ons, and which may utilize a corresponding configuration file, e.g., Addons.cfg. In one embodiment, a model plug-in add-on may be a model plug-in the process model invokes without requiring end users to create and configure a plug-in instance. This may be accomplished by placing a model plug-in function sequence file in a specified add-ons directory (i.e., folder), e.g., <TestStand Public>\Components\Models\ModelPlugins\Addons, to create a model plug-in add-on. In one embodiment, the process model may update the Addons.cfg file when the process model detects a new, removed, or updated plug-in in the Addons directory. Thus, for example, in response to a user putting plug-in function sequence files into the Addons folder, the plug-in framework may automatically insert one instance for each file into the addon configuration file. More specifically, the process model may automatically use the default set of options the add-on sequence file defines to create one plug-in instance for each add-on the Addons.cfg file contains.

In some embodiments, each configuration file may include multiple configurations, one of which may be designated as "active", and each configuration may have multiple plug-in instances. At run-time, the active configuration may be loaded from each configuration file (unless the user has specified a specific configuration name to load).

The active configurations from all configuration files may be merged into a single run-time configuration so that all plug-in instances in the active configuration of each configuration file are utilized.

At run time, the process model may read the set of plug-in instances to invoke from the plug-in configuration (.cfg) file(s), located in a specified directory, e.g., the <TestStand Application Data>\Cfg\ModelPlugins directory. In one embodiment, by default, the test executive system may be configured to create configuration files for the plug-ins in the specified (configuration) directory if the files do not already exist. For example, following the exemplary implementation described herein, the plug-in framework (or development environment) may create ResultProcessing.cfg and Addons.cfg configuration files in the <TestStand Application Data>\Cfg\ModelPlugins directory if the files do not already exist. Of course, other configuration files may be used as desired, the particular files disclosed herein being exemplary only.

Model Plug-In Categories

As noted above, in some embodiments, there may be one or more categories of plug-ins, each of which may have an associated configuration file. Accordingly, in one embodiment, each model plug-in file may specify a category name (see <NI_ModelPlugin>.CategorySpecific.Name) to determine when a plug-in can be invoked or made available. For example, in the Result Processing dialog box, one may insert only plug-in instances with the "ResultProcessor" category name. Similarly, an Offline Results Processing Utility (described in more detail below) may invoke only plug-ins with the "ResultProcessor" category name. Therefore, a user should not use "ResultProcessor" as the category name for a plug-in that does not act as a result processor.

In one embodiment, two configuration files may be provided by default: the file ResultProcessing.cfg, e.g., created via the Result Processing dialog box, as noted above, which may only contain plug-ins with a category of "ResultProcessor", and Addons.cfg, e.g., created automatically with one plug-in instance from each plug-in sequence file that is installed in an Addons\sub-directory.

However, if desired, the user may create their own dialogs (e.g., manually, or via a wizard) to create addition configuration files or create configuration files programmatically or by copying existing files. For example, a user might make a Semiconductor Device Handler plug-in dialog whereby the user may insert instances of plug-ins that have a category of "SemiconductorHandler". The dialog may accordingly create and/or write to a SemiconductorHandlersConfiguration.cfg file. At run-time, the model may load plug-in instances from this file, as well as from ResultProcessing.cfg and Addons.cfg (and any configuration files for other categories, e.g., various other "Handler" categories, or other categories, as desired).

Creating Process Model Plug-Ins

In one embodiment, process model plug-in sequence files may be required to meet the following conditions:

1. The model plug-in sequence files should be saved in appropriate directories, e.g., one of the following directories:
   <TestStand>\Components\Models\ModelPlugins (built-in plug-ins)
   <TestStand Public>\Components\Models\ModelPlugins (custom plug-ins)

<TestStand>\Components\Models\ModelPlugins\Addons (built-in add-ons)
<TestStand Public>\Components\Models\ModelPlugins\Addons (custom add-ons). It should be noted that the above directories are exemplary only.

2. An appropriate file global variable (structure) should be included, e.g., a global structure named ModelPluginComponentDescription that uses the NI_ModelPluginComponentDescription data type.

3. The type "Model" (or equivalent) should be specified as the type of the model plug-in sequence file, e.g., specified via a Sequence File Properties dialog box for the model plug-in sequence file.

4. The model plug-in sequence file should contain one or more plug-in entry point sequences, as appropriate for the plug-in functionality.

In some embodiments, plug-in entry-points may be invoked with synchronization constraints according to the type of process model being used.

For example, in one embodiment, for all process models, the Begin entry point in the controller thread may be required to complete before any Begin entry point in any test socket thread starts. Additionally, all End entry points in any test socket thread may be required to complete before the End entry point in the controller thread starts.

In some embodiments, batch process models may have specific synchronization constraints. Examples of such synchronization constraints for batch process models may include: All Begin entry points in all test socket threads may be required to complete before the Pre Batch entry point starts. The Pre Batch entry point may be required to complete before any Pre UUT entry points start. All restarted test socket threads may be required to reach the same sync point as the remaining, active test socket threads before any Pre UUT entry points start. All UUT Start entry points may be required to complete before the Batch Done entry point starts. The Batch Start entry point may be required to complete before any UUT Done entry points start. All Post UUT entry points may be required to complete before the Post Batch entry point starts. Of course, any such synchronization constraints may be used as desired.

In one embodiment, "on-the-fly" results processing functionality may be supported. For example, a plug-in to process results on-the-fly may be enabled by setting a ProcessOnTheFly subproperty to True, and the test executive system may progressively collect results concurrent with the test execution. When the test executive system collects a result and exceeds a threshold in time or in the number of collected results, the process model may pass the results collected since the last time the test executive system exceeded the threshold to the Model Plugin—OnTheFly Step Results entry point for processing (see exemplary entry point descriptions above).

A plug-in that processes results on-the-fly, such as a report generator or a database logger, may typically append data to a report or logs the data to a database while iterating through each array of results the model passes to the OnTheFly Step Results entry point.

FIGS. 7A-7F—Exemplary User Interfaces

FIGS. 7A-7F illustrate exemplary user interfaces for specifying, configuring, and managing, process model plug-ins, according to various embodiments.

Figure 7A:
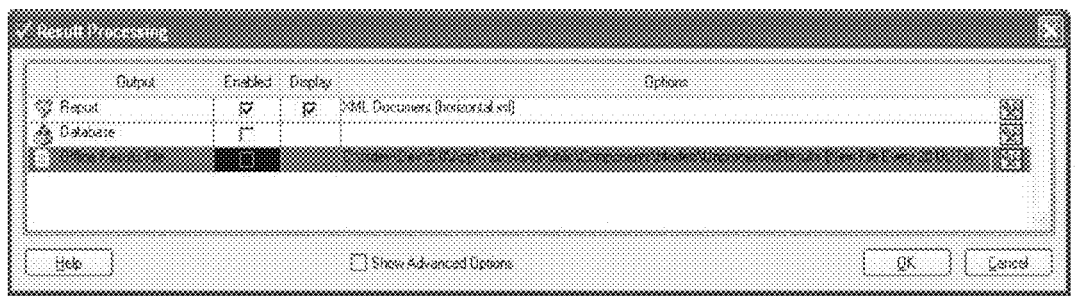
FIGS. 7A-7E illustrate various user interfaces for specifying, configuring, and managing, process model plug-ins, according to various embodiments.

FIG. 7A illustrates an exemplary UI for plug-ins of the Result Processor category, specifically, a Result Processing dialog box. As shown, the dialog box presents various (basic) options for plug-ins of this category, including an XML Document option and an offline unprocessed (i.e., raw) results option, each with corresponding "Output", "Enabled", and "Display" fields. The Result Processing dialog box may be used to configure how the test executive system processes the results the user's test sequences generate. For example, one can choose to generate reports, log to databases, or store results in compact offline result files for later processing. Additional options may be included for processing results if additional Result Processing Plug-ins have been created or installed.

In this exemplary embodiment, by default, the Result Processing dialog box displays without showing its advanced options. In this case it contains only a table with one row in the table for each of the installed Result Processing Plug-ins. One can enable or disable each plug-in, and can configure the options for how each plug-in processes test results.

Figure 7B:
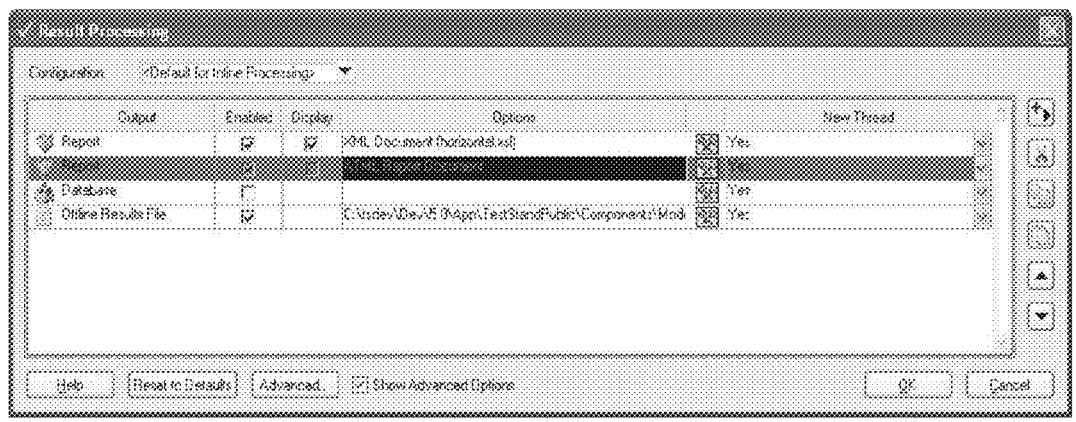

If the user checkmarks the Show Advanced Options checkbox, the dialog box may display additional controls, as illustrated in FIG. 7B. With these additional controls, the user may insert or delete Result Process Processing Plug-in instances, change the order in which the test executive system invokes them, and specify whether the test executive system invokes them serially or in parallel using separate threads. The user can also create and manage multiple sets of configured Plug-in instances. Each set may be referred to as a Result Processing Configuration.

Exemplary advanced options provided by the embodiment of FIG. 7B may include (but are not limited to) any of:

Configuration—This drop down list (see Configuration control in the top left of the dialog box) selects which Result Processing Configuration is active. The Plug-in Instance Table may display the plug-in instances in the active configuration and the test executive system may use the active configuration to process results inline, where inline means at runtime. The user may also select a "Manage Configurations . . . " item to display a corresponding Manage Result Processing Configurations dialog box.

Plug-in Instance Table—Each row in this table specifies a result processing plug-in and the options with which to invoke it. The user may insert instances of the same plug-in on multiple rows to invoke the plug-in multiple times with varying options. For example, a user may do this to create multiple reports with different formats or to log to multiple databases. Each row in the table may have the following columns:

Output—Indicates the type of output the results processing plug-in creates. The user may be allowed to edit the name to make it more descriptive.

Enabled—Indicates whether the test executive system invokes the plug-in instance when processing results.

Display—This column only appears if a plug-in instance that uses it is in the table. In one embodiment, of the provided plug-ins, only the Report Generation plug-in uses the Display column. For multiple instances of the Report Generation plug-in, the checkbox in the display column specifies which instance displays its report by default in a test executive system Report View. At run-time, the user may still view a report from a different plug-in instance in the Report View by selecting from an Active Report menu from the Report View toolbar. To create reports without the overhead of displaying them in the report view, one may deselect the Display checkbox for all Report Generation plug-in instances.

Options—Displays a summary of the most important option settings for the plug-in instance. One may click the Options button to display the options dialog box for the plug-in instance.

New Thread—Specifies how the test executive system (e.g., TestStand) invokes the plug-in. The options may include:

Yes—the test executive system invokes the plug-in in a new thread. It processes results in parallel with other plug-ins and with the testing of subsequent UUTs.

No—the test executive system waits for the plug-in to complete its processing before invoking the next plug-in in the table, including plug-ins with New Thread set to Yes.

Yes, But Complete before next UUT—invokes the plug-in in a new thread but waits for the plug-in to complete before testing begins on the next UUT.

Insert New Plug-in Instance—Displays a menu of the installed result processing plug-ins. One may select an item from the menu to insert a new instance of the plug-in into the Plug-in Instance Table.

Cut—Removes the selected plug-in instance and places it on the clipboard.

Copy—Copies the selected plug-in instance to the clipboard.

Paste—Copies the plug-in instance on the clipboard into the Plug-in Instance Table.

Move Up—Moves the plug-instance toward the beginning of the Plug-in Instance Table.

Move Down—Moves the plug-instance toward the end of the Plug-in Instance Table.

Help—Displays the help topic for the Result Processing dialog box.

Reset to Defaults—Replaces the contents of the current active configuration with one instance of each installed result processing plug-in. Each instance is configured with its options in their default state. This action prompts the user to select whether they intend to use the configuration for inline or offline processing. If offline is selected, the action does not insert an instance of the Offline Result Generation plug-in because the user already has an offline results file to process.

Advanced . . . —Displays the Advanced Result Processing Settings dialog box.

Show More Options—When unchecked, the dialog hides most of its controls and the user can only edit the options of the plug-in instances that exist in the active configuration.

Figure 7C:
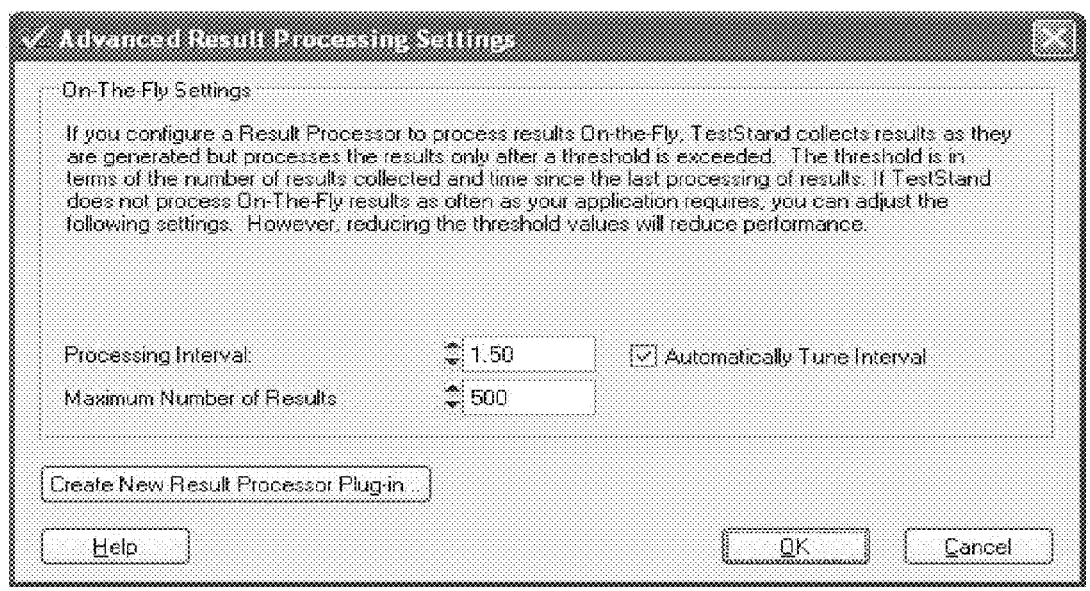

FIG. 7C illustrates an exemplary Advanced Result Processing Settings dialog box, according to one embodiment. The dialog may be launched via the user clicking on the Advanced button in the Result Processing dialog box, and may be used to configure advanced options that apply to result processing for all plug-in instances in all configurations and to create new Result Processing Plug-ins, e.g., to configure on-the-fly result processing options that apply to all plug-in instances in all configurations, such as specifying and managing the processing interval and specifying the maximum number of results. The options in this dialog box may apply only to the on-the-fly results processing action the test executive system takes when it generates a result. The test executive system may not process results for a thread while a code module in the same thread executes, regardless of how long the code module takes to execute. Additionally, these options may set only maximum thresholds to trigger result processing. Depending on the internal requirements of the result processing plug-ins used, on-the-fly result processing might occur more frequently than the maximum values set in this dialog box.

Options supported may include:

Processing Interval—Specifies the duration in seconds since the last processing of on-the-fly results after which a new result will trigger processing of the accumulated on-the-fly results. Said another way, this option specifies the duration in seconds to wait after processing on-the-fly results before processing the next set of accumulated on-the-fly results. When a new result is available and time interval exceeds the value set for this option, the test executive system begins processing the results.

Automatically Tune Interval—Specifies that the test executive system also initiates processing of the accumulated on-the-fly results when a new result is generated and the number of accumulated results equals or exceeds the number of results that the test executive system estimates can be processed within the duration of the value of Processing Interval. Enabling this option may ensure that large amounts of rapidly generated results do not cause long pauses in test execution during on-the-fly result processing.

Maximum Number of Results—Specifies the number of accumulated on-the-fly results at which to begin processing the results. The test executive system initiates the processing of accumulated on-the-fly results when a new result is generated and the number of accumulated results meets or exceeds this value. In other words, when a new result is available and the number of accumulated on-the-fly results equals or exceeds the value set for this option, the test executive system begins processing the results. If the user wants each result to be processed immediately after it is generated, this value should be set to 1.

In one embodiment, the test executive system may initiate processing of results when it generates a new result and either the Processing Interval or the Maximum Number of Results is exceeded. In a further embodiment, if the user sets the thresholds for processing on-the-fly results so low that only a single result or a very small number of results accumulate before they are processed, the overall time to process results may be increased significantly.

In yet another embodiment, the controls that govern when on-the-fly results are processed may apply to the decision regarding whether to process that the test executive system makes after it generates a result. The test executive system may not process results for a thread while a code module in the same thread executes, regardless of how long the module takes. In addition, these controls may set maximum thresholds that trigger result processing. Depending on the internal requirements of the Result Processing Plug-ins used, on-the-fly result processing might occur more frequently than these thresholds specify.

Create New Result Processor Plug-in . . . —Creates a new Result Processor Plug-in sequence file and opens the file. The user may complete the entry points in the file that the user's processor requires and delete the ones it does not. The user should also update the appropriate result processor (e.g., plug-in) description, e.g., FileGlobals.ResultProcessorComponentDescription in the user's plug-in according to the user's requirements.

Figure 7D:
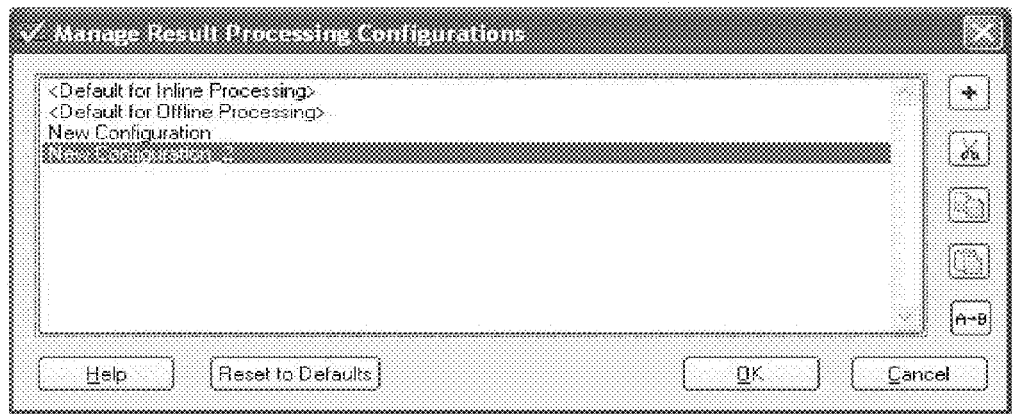

FIG. 7D illustrates one embodiment of an exemplary Manage Result Processing Configurations dialog box, which may be used to create or delete Result Processing Configurations. In one embodiment, a Result Processing Configuration is a named set of result processing plug-in instances. Having multiple configurations allows a user to quickly change how results are processed by changing the active configuration. It also allows the user to specify that offline result files are processed differently than inline results or that offline results files stored in different locations are processed differently. By default the dialog box contains two configurations that can be edited but not deleted or renamed:

<Default for Inline Processing>—This configuration is the default active configuration for processing results at runtime.

<Default for Offline Processing>—This configuration is the default configuration used by the Offline Results Processing Utility.

In some embodiments, the user may create any number of additional configurations. For example, in one embodiment, the user may select the configuration that processes inline results with the Configuration control on the Result Processing dialog box (see, e.g., FIG. 7B). As noted above, this control is visible only if Show Advanced Options is selected on the Result Processing dialog box. The user may select the configuration that processes offline results files for an Offline Result Processing Profile by editing the profile in the Offline Results Processing Utility. Exemplary options the user may select include:

Configuration List—Display the list of all Result Processing Configurations.

Insert New—Inserts a new configuration into the Configuration List.

Cut—Removes the selected configuration and places it on the clipboard.

Copy—Copies the selected configuration to the clipboard.

Paste—Copies the configuration on the clipboard into the Configuration List.

Rename—Renames the selected configuration.

Help—Displays the help topic for the Manage Result Processing Configurations dialog box.

Reset to Defaults—Deletes all configurations and replaces them with the two default configurations: <Default for Inline Processing> and <Default for Offline Processing>.

In some embodiments, the Offline Results Generation plug-in may be configured to perform a high speed unabridged dump of the raw results to a file. In one embodiment, the (dumped) data may include all data except for plug-in configuration data. In other words, all data that can be used for online processing, e.g., for reports or database logging, may be dumped, such that the same results processing output, e.g., reports or database entries/logs, generated "online" by the system can be generated later offline, e.g., by the Offline Results Processing Utility. Thus, for example, the data may include test results, user data, machine/instrument data, etc., but may not include plug-in configuration data, as this aspect may instead be configured and performed by the Offline Results Processing Utility.

In some embodiments, the same software that generates the (online) results processing output (e.g., the Results Processing plug-in(s), as described above) may be used in both situations (online and offline). This may be accomplished by reconstructing the same execution threads and execution order employed in the online results processing. Accordingly, a configuration utility may be provided whereby a user can manage the conversion of the offline results processing output. In various embodiments, the configuration utility may be a GUI or command-line based. Moreover, results processing output generation may be on demand, or scheduled and continuous, as desired.

Figure 7E:
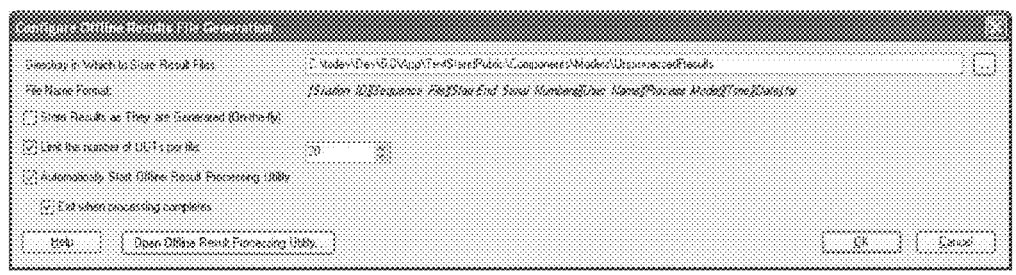

FIG. 7E illustrates one embodiment of an exemplary Offline Results File Generation Options dialog box, which may be used to specify options for an instance of the Offline Results Generation plug-in. Exemplary options or controls that may be supported include, but are not limited to:

Directory in Which to Store Result Files—Specifies the directory in which the plug-in instance stores offline result files.

File Name Format—Indicates how the plug-in chooses the name of the result file. Note that in some embodiments, the user may not be allowed to edit this control. If a file already exists that has the same name as the file name the plug-in selects, the plug-in may append a number to the file name to make it unique.

Store Results as They are Generated (On-the-fly)—Specifies whether the plug-in writes the results to the file after each UUT completes or if it writes the results on-the-fly. If the user selects to save results on-the-fly, the user may control how frequently the plug-in writes results by setting options on the Advanced Result Processing Settings dialog box.

Limit the number of UUTs per file—Specifies whether the plug-in stores all the results from an execution in a single file, or whether it creates a new result file whenever the current file contains the results for a specified number of UUTs. The limit may be an approximate threshold and may be exceeded for such purposes as keeping the results for all the UUTs in a particular batch within the same results file.

Automatically Start Offline Results Processing Utility—Specifies whether to start the Offline Results Processing Utility when the Offline Result File Generator creates a new results file and the utility is not already running.

Exit When Processing Completes—Specifies whether the Offline Results Processing Utility automatically exits when it completes all processing. This option may have no effect when the utility is already launched by the user.

Help—Displays the help topic for the Configure Offline Results File Generation dialog box.

Open Offline Results Processing Utility—Launches the Offline Result Processing Utility.

Thus, the Offline Results Generation plug-in, with corresponding Offline Results File Generation Options dialog box, may provide functionality for (high speed) dumping (storing) raw (unprocessed) results data to a specified location (or locations), e.g., for subsequent processing by the Offline Results Processing Utility application.

Offline Results Processing Utility

In some embodiments, an Offline Results Processing Utility (application), referred to herein as "the utility", for brevity, may be provided for processing the raw or unprocessed results data generated by the test executive system, e.g., by or in accordance with the Offline Results Generation plug-in. In some embodiments, the Offline Results Processing Utility may provide the same processing functionality as the online processing aspects of the test executive system, and in some embodiments, may utilize the same relevant plug-ins. Accordingly, some or all of the results processing plug-ins and configuration tools, e.g., dialogs, described above may be utilized by the utility. Thus, the Offline Results Processing Utility may be considered to be a "re-processor" that can be configured to process the offline data (file(s)) as if the data were coming from the online test(s). Note that the name "Offline Results Processing Utility" is exemplary, and that the Offline Results Processing Utility may be called any other name as desired.

Figure 7F:
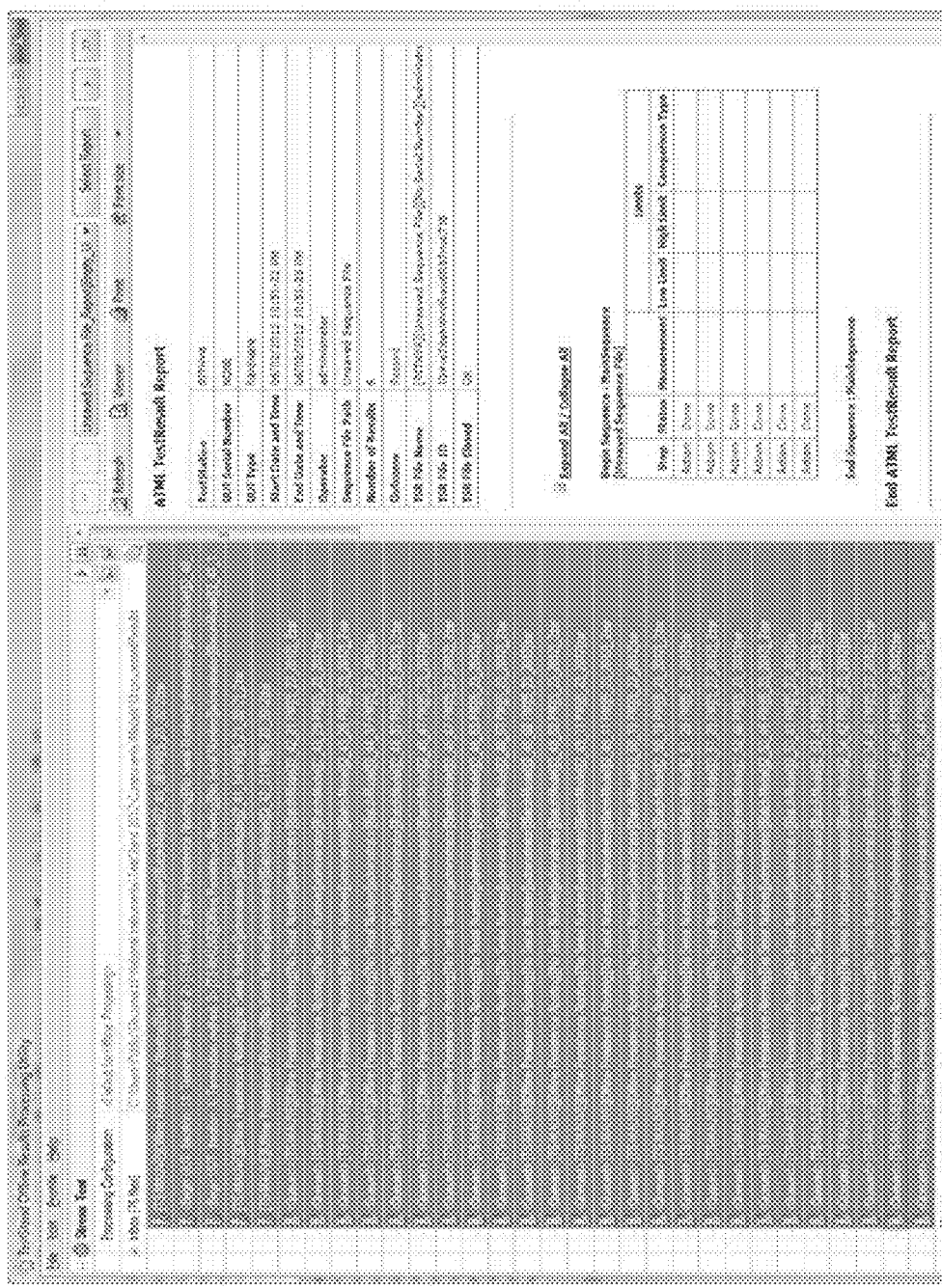
FIG. 7F illustrates an exemplary GUI for one embodiment of an Offline Results Processing Utility application.

In one exemplary embodiment, the utility may be launched from a UI, such as a tools dialog or menu, e.g., by selecting Tools>>Offline Results Processing Utility or Start>>Programs>>National Instruments>>TestStand>>Tools>>Offline Results Processing Utility, or so forth. The utility may be configured to process raw results files into reports or database tables at a time other than when sequence execution occurs, such as overnight, or on a different computer, and thus may be used in situations in which performance is more important than immediately processing results. The utility may include a UI, e.g., a graphical user interface (GUI), whereby the utility may be configured for desired functionality. FIG. 7F illustrates an exemplary GUI for one embodiment of the Offline Results Processing Utility application. As may be seen, in this illustrative embodiment, the exemplary GUI of FIG. 7F includes a menu or tool bar for invoking File, Edit, Profile, and Help functionalities, as well as various windows or panes for setting and/or displaying configurable options, described in more detail below. It should be noted that the GUI described is but an exemplary embodiment following the TestStand based example from above, and that other embodiments may be based on other test executive system as desired.

In one embodiment, specified configurations may be defined and stored as profiles via the GUI. For example, a user may select a UI item, such as Profile>>New or may right-click in a profiles pane (described in more detail below) of the utility's GUI and select New Profile from a context menu to create a profile. Profiles may be used to define a set of raw results files to process, to specify the result processing configuration set to use to process results, to specify the sequence file to use as the callback file when processing the raw results files, and/or to track files the utility has already processed. In one embodiment, each profile may include an "inbox" (or functional equivalent, e.g., "data source"), which may be used to specify where to store raw results files to process, and an "outbox" (or functional equivalent, e.g., "output target") to specify where to store raw results files and reports after processing. The user may also configure the number of files the utility processes simultaneously.

In some embodiments, when the utility generates a report after processing, it may add a unique ID to the report file name. In one exemplary TestStand-based embodiment, the utility may add a TestStand Results (TSR) ID to each report file name. The ID may be or include a unique (e.g., alphanumeric) string identifying the raw results file from which the report was generated. After processing a raw results file, the utility may automatically move the file to the output target, e.g., to the outbox. If another raw results file with the same name exists in the outbox, the utility may automatically append the ID to the end of the name of the processed file.

In one embodiment, the GUI may include a section, e.g., a pane or window, for displaying and/or navigating through reports generated by the utility from specified raw results files. For example, the GUI may include a Report List pane configured to display a list of reports the utility generated from the raw results file of the same name, as shown in the top left portion of the GUI. Moreover, Next Report and Previous Report buttons (i.e., "next" and "previous" buttons) may be provided to show the next or previous unread report. As used herein, an "unread report" is one that the utility has not opened during the current session. In some embodiments, this pane may use the same controls as a Report pane in a sequence editor Execution window.

In one embodiment, the GUI may include a UI, e.g., a dialog box, for setting utility configuration options. For example, again following the TestStand example, a user may select a File>>Settings menu item to launch the TestStand Offline Results Processing Utility Settings dialog box, in which the user may set utility configuration options.

In one embodiment, the GUI may include a status bar that may be configured to display a default callback file and report selected in the Report List pane described above. In some embodiments, the user may use command-line arguments or a Call Executable step with command-line arguments in a sequence to launch the offline results processing utility. In further embodiments, the user may also use scheduled tasks in an operating system, e.g., Microsoft Windows™, to launch the offline results processing utility with command-line arguments. The utility may reside in a specified directory, e.g., <TestStand>\Components\Tools\Offline Results Processing Utility\OfflineResultsProcessingUtility.exe. If the user wants the offline results processing utility to run a specified amount of time, the user may create two tasks and specify a /quit argument (or equivalent) for the second task to stop the utility immediately.

Exemplary Profiles Pane

As noted above, in some embodiments, the GUI for the Offline Results Processing Utility may include a profiles pane (or equivalent) that may be configured to include (and display) a list of profiles to use to process files. The profiles pane may include any of various options, exemplary examples of which may include one or more of:

Profile Name—Specifies the unique profile name for command-line arguments and log files.

Activate—Processes available files in the inbox. The utility may determine an optimum number of available files in the inbox to process at the same time. The Offline Results Processing Utility Settings dialog box may be used to adjust the number of files to process simultaneously. Note that in some embodiments, when the user launches the utility, it may automatically activate profiles that were active during the previous processing session.

Pause—Pauses processing files in the inbox. The utility may finish processing the currently processing files and may not start processing any new files.

Processing Configuration—Specifies the result processing configuration set to use to process the raw results files. This option may include one or more sub-options, e.g.:

New Configuration—Launches the Manage Result Processing Configurations dialog box, in which the user may create or delete result processing configurations.

Edit Configuration—Launches the Result Processing dialog box, in which the user may enable or disable only the installed built-in and custom result processing model plug-ins in the active result processing configuration and configure how the model plug-ins process test results.

Inbox—Specifies the directory in which to store raw results files. When a user creates a new file in this directory, the utility may add the file to the inbox and process the file if the profile is active.

Outbox—Specifies the directory in which to store raw results files and reports after processing.

Callback file—Specifies the sequence file to use as the callback file when processing the raw results files. This option may supersede any default callbacks file selected in the Offline Results Processing Utility Settings dialog box. If the user does not specify a callback file in this option, the utility may use the default callback file. If the user does not specify a default callback file, the utility may not use any callback file.

A Clear Settings button may be selected to reset the callback file to the default setting if the user made changes to this option.

Exemplary Offline Results Processing Utility Menus

As indicated above, in some embodiments, the Offline Results Processing Utility may include File, Profile, and/or Help menus. Exemplary menu items under these menus are now described.

In one embodiment, the File menu may contain one or more of the following options:

Settings—Launches the Offline Results Processing Utility Settings dialog box, in which you set utility configuration options.

Minimize to System Tray—Minimizes the utility in the Microsoft Windows System Notification Area (system tray) of the taskbar.

Exit—Closes the utility.

In one embodiment, the Profile menu may include one or more of the following options:

New Profile—Creates a new profile.

Activate All Profiles—Activates all profiles.

Pause All Profiles—Pauses all profiles.

In one embodiment, the Help menu may include one or more of the following options:

Help—Launches the help topic for the utility.

About—Displays version information for the utility.

Additionally, in some embodiments, context menus may also be provided, e.g., menus that are invoked and displayed in the GUI upon user interaction, e.g., a right mouse click, etc. Thus, for example, in one embodiment a Profiles Pane Context Menu may be provided that includes one or more of the following options:

Process Files Using <Profile Name>—Uses a profile selected by the user to process the selected files.

Clear Inbox of Profile—Deletes all files in the inbox.

Clear Outbox of Profile—Deletes all files in the outbox.

Retry Processing Selected Files Using <Profile Name>—Uses the profile select by the user to reprocess selected files if processing errors exist.

Process Selected Files Immediately Using <Profile Name>—Uses the profile selected by the user to immediately process the selected files before processing any other queued files. The utility may open up to twice the number of threads specify by the user in the Offline Results Processing Utility Settings dialog box to handle this request.

Process Selected Files Again Using <Profile Name>—Moves the selected files to the inbox and reprocesses them using the profile you select.

Force Move File to Outbox of <Profile Name>—Immediately moves the selected file to the outbox (or data target) of the profile selected by the user. If a name collision exists, the utility may rename the file selected by the user and the corresponding report files with unique names.

Delete Selected Files—Deletes the files select by the user.

New Profile—Creates a new profile.

Delete Profile—Deletes the profile selected by the user.

Open Containing Folder in Explorer—Opens a Microsoft Windows Explorer (or other file/directory browser or finder) in the directory that contains the file selected by the user.

Copy Paths of Selected Files—Copies to the clipboard the paths of the file selected by the user.

As mentioned above, in some embodiments, an Offline Results Processing Utility Settings dialog box may be provided for configuring options (e.g., settings) for the Offline Results Processing Utility. The dialog may be launched via user selection of a control in the GUI, e.g., by selecting File>>Settings, and may be used for performing one or more of the following tasks:

Use a default callback sequence file for configuration sets that do not specify a callbacks file.

Launch during system startup or to automatically start minimized in the Microsoft Windows System Notification Area (system tray) of the taskbar.

Conditionally delete raw results files and report list files from the outbox.

In one exemplary embodiment, the Offline Results Processing Utility Settings dialog box may include one or more of the following options for configuring the Offline Results Processing Utility:

Delete Processed Files—Sets the following conditions to delete only raw results files and report files from the outbox after processing:

Never—Never deletes files.

Immediately—Deletes files immediately after processing.

When files are older than the specified number of days—Specifies the number of days, according to the current system time, after the creation date of the file to wait before deleting the file. When the number of days exceeds this limit, the utility deletes the file.

When more than the specified number of files exist in the outbox—Specifies the number of files to exist in the outbox. When the outbox exceeds this limit, the utility deletes the oldest files.

Number of Files Processed Simultaneously—Specifies the number of files to process at the same time. In one embodiment, the default is the number of processing cores on the computer. Modifying this value may lead to performance improvements, depending on the hard drive and the number of cores on the computer.

Note that in some embodiments, if the offline processing utility is configured to generate the results from individual .tsr files to a single report file, the order in which results appear in the report file may not match the order in which they were generated during normal execution. To avoid this behavior, the offline processing utility may be launched before generating any .tsr files and the value of Number of Files Processed Simultaneously may be set to 1, or the offline processing utility may be configured to generate results from individual .tsr files to separate, uniquely named report files.

Similarly, in some embodiments, if the offline processing utility is configured to generate the results from individual .tsr files to a single report file, the order in which results appear in the report file may not match the order in which they were generated during normal execution. To avoid this behavior, the offline processing utility may be launched before generating any TSR files and the Number of Files Processed Simultaneously control set to 1. Alternatively, the offline processing utility may be configured to generate results from individual .tsr files to separate, uniquely named report files.

Default Callback File—Specifies the default callback file to use for configuration sets that do not specify a callback file.

Launch on startup/Remove from startup—Launches the utility during system startup or removes the utility from launch on startup. Note that some operating systems, e.g., Microsoft Windows 7/Vista, may require privileges elevation for this action.

In some embodiments, command-line arguments may be used with the Offline Results Processing Utility. The following table lists exemplary command-line arguments a user may use with the offline results processing utility. Optional arguments appear in brackets. If the utility is already running, the command-line arguments may apply to the running instance of the utility. The user may also store the command line standard output in a log file. Note that these arguments and their corresponding actions are meant to be exemplary only, and that any other arguments and actions may be used as desired.

/?—Displays the help topic for the utility.

/exit-when-done [seconds]—Instructs the utility to exit automatically when all active profiles finish processing files successfully. The utility may be required to process at least one file before exiting. If the utility is already running, this command may have no effect. "[seconds]" specifies the number of seconds to wait after all active profiles finish processing before exiting. The default value may be 30 seconds (or any other value, as desired).

/log-level <log level>—Uses a number or a string to specify one of the following values for a supported severity level to log. Passing an invalid value may disable logging.
  0 or Debug—Debugging information.
  1 or Info—Run-time events that provide information on the state of the system.
  2 or Warn—Warnings that are not errors but that might indicate an underlying error.
  3 or Error—Run-time errors or unexpected conditions.
  4 or Fatal—Severe errors that might limit the functionality of or terminate the offline results processing utility.
  5 or DisableLogging—Disables logging.

/process-all-profiles—Activates all profiles.

/process-files <profile><one or more filenames>—Activates the profile specified by the user and copies all the files specified by the user to the outbox directory of the profile for processing. Quotation marks may be used to escape profile names or filenames that include spaces. One example of the use of this argument is:
  OfflineResultsProcessingUtility.exe "Profile Name" file1.txt "C:\Documents and Settings\file2.txt", where arguments are provided to the utility specifying the profile's name and two files to be copied.

/process-files-missing-data—Automatically processes files with missing data. Files may not include all necessary data because the execution that created the file terminated or aborted while the test executive system was generating results. The user may review the log file to determine the files with missing data. If the user automatically processes files with missing data, the test executive system may return a warning, which the user may log by using a log level of 2, 1, or 0. The test executive system may return an information message for files with missing data that the user does not process, which the user may log by using a log level of 1 or 0.

/process-no-profiles—Deactivates all profiles.

/process-profiles <one or more profile names>—Activates the profiles with the names the user specifies in the list of profiles. Quotation marks may be used to escape profile names that include spaces. An example use of this argument is:
  OfflineResultsProcessingUtility.exe Profile1 "Profile Name With Spaces" Profile3.

/quit—Stops the utility after the currently processing raw results files finish processing.

/tray—Sends the utility to the Microsoft Windows (or other OS) System Notification Area (system tray) of the taskbar.

Distributed Results Accumulation and Dispatch

In some embodiments, the test executive system may provide for distributed results accumulation or collection and dispatch to plug-ins. More specifically, the test executive system may support accumulation and dispatch of results data to plug-ins for storage and/or processing in chunks to amortize the cost of dispatch and processing. The chunk size may be controllable by one or more specified criteria. For example, in various embodiments, the criteria may include one or more of: explicit programmatic and (GUI settable) options such as maximum number of results per dispatch, or maximum time between dispatches, policies that enforce implementation requirements of particular plug-ins, such as upon entry to a subsequence or upon exit from a subsequence, or an auto-tuned threshold. One example of an auto-tuned threshold is a threshold based on the time measured for the dispatch and processing of prior results.

Another example of such a threshold is a time threshold between chunks that automatically ensures that the dispatch and processing time does not exceed the time threshold the user specified for batching results. This may provide a smoother alternation of execution and processing in the case where results can be generated far faster than they can be processed. Otherwise, execution may appear to proceed rapidly and then suspend for processing durations that are so long that they are confusing and uncomfortable to the user.

A further example of such a threshold is a maximum threshold determined by the explicit and policy requirements of the union of all active plug-ins that process results as they are generated. In other words, the requirements of all active plug-ins that process results on-the-fly may be used to programmatically determine this maximum threshold.

As noted above, in some embodiments, test executive systems may utilize special sequence in the process model, referred to as model callbacks. Model callbacks are sequences that are typically executed inside of a process model, but for which client sequences can override the default behavior. When a callback is overridden, rather than calling the code inside of the process model sequence, code is executed in the client sequence. In some embodiments, one or more callbacks may be defined or provided for posting results, e.g., for subsequent offline processing, e.g., by the Offline Results Processing Utility. One exemplary post results processing callback may be called "PostResultsCallback", and may have various configurable properties. This callback and its properties may thus operate as an API (Application Programming Interface) for posting, logging, or otherwise storing results, e.g., for offline processing. Examples of such properties include, but are not limited to:

PostResultsCallback_PreFlushMask—This property may be utilized via the exemplary call: Execution.PostResultsCallback_PreFlushMask, and may have a data type of "long". The test executive system may call PostResults callbacks with all accumulated results before entering any sequence specified by the user via this property.

Similarly, a PostResultsCallback_PostFlushMask property may be used via the exemplary call: Execution.PostResultsCallback_PostFlushMask, and may also have a data type of "long". The test executive system may call PostResults callbacks with all accumulated results before exiting any sequence the user specifies using this property.

Thus, for example, a user may (typically) set pre-flush and post-flush post-flush masks when a Model Plugin—OnThe-Fly Step Results entry point requires that the Context parameter of the entry point (see above) refers to the same sequence stack frame that executes all the steps in the Steps parameter of the entry point. Otherwise, the Steps parameter of the entry point can contain steps from multiple stack frames. Using this technique may result in fewer steps for each invocation of the OnTheFly Step Results entry point, which may affect performance.

A PostResultsCallbackInterval property may be utilized via: Execution.PostResultsCallbackInterval, and may have a data type of "double". This property may specify the interval at which threads in the execution call PostResults callbacks. Thus, if the time since a thread last called the PostResults callback equals or exceeds the value of this property, the thread may call the PostResults callback when the test executive system next generates a result. If the interval is a negative number, the absolute value may determine the interval. In this case, threads may call PostResults callbacks if the number of results accumulated exceeds the estimate of how many results the test executive system can process within the interval based on the duration of previous PostResults callbacks. This mechanism may provide more of a balance between result generation and result processing tasks if result generation is much faster than result processing.

A PostResultsCallbackMask property may be used via Execution.PostResultsCallbackMask, with a data type of "long", and may specify the mask of the sequences in which the test executive system accumulates step results to transfer as a parameter to the PostResults callbacks sequence. The user may typically specify the callback mask if a custom process model plug-in processes results on-the-fly.

In some embodiments, one or more constants may be provided for specifying options for the PostResultsCallbackMask property. These constants may thus represent the options a user can use with the Execution.PostResultsCallbackMask, Execution.PostResultsCallback_PreFlushMask, and Execution.PostResultsCallback_PostFlushMask methods. The bitwise-OR operator may be used to specify more than one option for a method. Exemplary constants and associated values may include (but are not limited to):

PostResultsCallbackMaskOption_All (Value: −1)—Specifies to call PostResults callbacks with all accumulated results for all sequences with specified exceptions, e.g., except for SequenceFileLoad callback and SequenceFileUnload callback sequences.

PostResultsCallbackMaskOption_None (Value: 0)—Specifies not to call PostResults callbacks.

PostResultsCallbackMaskOption_PostAction (Value: 128)—Specifies to call PostResults callbacks with all accumulated results for all PostAction callback sequences.

PostResultsCallbackMaskOption_PostInteractive (Value: 8)—Specifies to call PostResults callbacks with all accumulated results for all PostInteractive callback sequences.

PostResultsCallbackMaskOption_PostResultListEntry (Value: 16)—Specifies to call PostResults callbacks with all accumulated results for all PostResultListEntry callback sequences.

PostResultsCallbackMaskOption_PostStep (Value: 2)—Specifies to call PostResults callbacks with all accumulated results for all PostStep callback sequences.

PostResultsCallbackMaskOption_PostStepFailure (Value: 64)—Specifies to call PostResults callbacks with all accumulated results for all PostStepFailure callback sequences.

PostResultsCallbackMaskOption_PostStepRuntimeError (Value: 32)—Specifies to call PostResults callbacks with all accumulated results for all PostStepRuntimeError callback sequences.

PostResultsCallbackMaskOption_PreInteractive (Value: 4)—Specifies to call PostResults callbacks with all accumulated results for all PreInteractive callback sequences.

PostResultsCallbackMaskOption_PreStep (Value: 1)—Specifies to call PostResults callbacks with all accumulated results for all PreStep callback sequences.

PostResultsCallbackMaskOption_SequenceCall (Value: 256)—Specifies to call PostResults callbacks with all accumulated results for all non-Engine callback sequences.

The above exemplary constants illustrate the breadth of possible settings for the PostResultsCallbackMaskOption set.

An exemplary property for specifying or modifying post results callback options is PostResultsCallbackOptions, which may be used via Execution.PostResultsCallbackOptions, and may have a data type of "long". This property may be used to specify options for when the test executive system calls PostResults callbacks. Exemplary constants corresponding to these options may be used modify when the test executive system invokes PostResults callbacks, and may include:

PostResultsCallbackOption_CallAfterProvisionalResult (Value: 1)—Overrides the options and specifies that the test executive system calls the PostResults callback after collecting each provisional result.

PostResultsCallbackOption_NoOptions (Value: 0)—Specifies no PostResults callback options.

Thus, the system may allow the user to control when and in what manner results from testing may be output (posted). In this way, the generation, posting, and processing of results data may be tuned to enhance or optimize the user's experience.

The various techniques and components described above may be used to perform corresponding methods, e.g., via execution of program instructions by a processor, with various of the above system components performing respective method elements. Moreover, it should be noted that in various embodiments, any combinations of the above techniques and components may be used as desired.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A computer-implemented method comprising: utilizing a computer to perform:

creating a test executive sequence, wherein the test executive sequence includes a first plurality of steps to be performed by a test executive engine to test a unit under test (UUT); and configuring the test executive sequence with a process model, wherein the process model includes a second plurality of steps to be performed by the test executive engine before and/or after executing the first plurality of steps, wherein the process model is configured to accept process model plug-ins to define the second plurality of steps, wherein said configuring the test executive sequence with the process model comprises selecting one or more process model plug-ins for the process model, wherein each process model plug-in includes two or more of the second plurality of steps;
wherein the one or more process model plug-ins include a first process model plug-in configured to store and/or process test result data dispatched to the first process model plug-in in chunks, wherein chunk size is controllable by an auto-tuned threshold that is based on time measured for the dispatch and processing of prior results.

2. The method of claim 1, wherein chunk size is configurable by user input.

3. The method of claim 1, wherein chunk size is further controllable by one or more specified criteria, comprising:
one or more programmatic or graphical user interface (GUI) settable options.

4. The method of claim 3, wherein the one or more programmatic or graphical user interface (GUI) settable options comprise one or more of:
maximum number of results per dispatch; or
maximum time between dispatches.

5. The method of claim 3, wherein the one or more policies that enforce implementation requirements of the first process model plug-in comprise one or more of:
upon entry to a subsequence; or
upon exit from a subsequence.

6. The method of claim 1, wherein the auto-tuned threshold comprises a time threshold between chunks that automatically ensures that the dispatch and processing time does not exceed the time threshold the user specified for batching results.

7. The method of claim 1, wherein the auto-tuned threshold comprises a maximum threshold determined by explicit requirements and policy requirements of a union of all active plug-ins that process results as they are generated.

8. The method of claim 1, further comprising:
testing the UUT, wherein said testing comprises executing each of the process model plug-ins, comprising:
accumulating and dispatching test result data to the first process model plug-in in chunks; and
the first process model plug-in storing and/or processing the test result data in chunks.

9. The method of claim 1, further comprising:
receiving user input via a graphical user interface selecting each of the one or more process model plug-ins for the process model.

10. A non-transitory computer-accessible memory medium that stores program instructions executable by one or more processors to implement:
creating a test executive sequence, wherein the test executive sequence includes a first plurality of steps to be performed by a test executive engine to test a unit under test (UUT); and
configuring the test executive sequence with a process model, wherein the process model includes a second plurality of steps to be performed by the test executive engine before and/or after executing the first plurality of steps, wherein the process model is configured to accept process model plug-ins to define the second plurality of steps, wherein said configuring the test executive sequence with the process model comprises selecting one or more process model plug-ins for the process model, wherein each process model plug-in includes two or more of the second plurality of steps;
wherein the one or more process model plug-ins include a first process model plug-in configured to store and/or process test result data dispatched to the first process model plug-in in chunks, wherein chunk size is controllable by an auto-tuned threshold that is based on time measured for the dispatch and processing of prior results.

11. The non-transitory computer-accessible memory medium of claim 10, wherein chunk size is configurable by user input.

12. The non-transitory computer-accessible memory medium of claim 10, wherein chunk size is controllable by one or more specified criteria, comprising:
one or more programmatic or graphical user interface (GUI) settable options.

13. The non-transitory computer-accessible memory medium of claim 12, wherein the one or more programmatic or graphical user interface (GUI) settable options comprise one or more of:
maximum number of results per dispatch; or
maximum time between dispatches.

14. The non-transitory computer-accessible memory medium of claim 12, wherein the one or more policies that enforce implementation requirements of the first process model plug-in comprise one or more of:
upon entry to a subsequence; or
upon exit from a sub sequence.

15. The non-transitory computer-accessible memory medium of claim 10, wherein the auto-tuned threshold comprises a time threshold between chunks that automatically ensures that the dispatch and processing time does not exceed the time threshold the user specified for batching results.

16. The non-transitory computer-accessible memory medium of claim 10, wherein the auto-tuned threshold comprises a maximum threshold determined by explicit requirements and policy requirements of a union of all active plug-ins that process results as they are generated.

17. The non-transitory computer-accessible memory medium of claim 12, wherein the program instructions are further executable to:
test the UUT, including executing each of the process model plug-ins, comprising:
accumulating and dispatching test result data to the first process model plug-in in chunks; and
the first process model plug-in storing and/or processing the test result data in chunks.

18. The non-transitory computer-accessible memory medium of claim 12, wherein the program instructions are further executable to:
receive user input via a graphical user interface selecting each of the one or more process model plug-ins for the process model.

19. A system comprising:
one or more processors; and
memory storing program instructions, wherein the program instructions are executable by the one or more processors to implement:
creating a test executive sequence, wherein the test executive sequence includes a first plurality of steps to be performed by a test executive engine to test a unit under test (UUT); and
configuring the test executive sequence with a process model, wherein the process model includes a second plurality of steps to be performed by the test executive engine before and/or after executing the first plurality of steps, wherein the process model is configured to accept process model plug-ins to define the second plurality of steps, wherein said configuring the test executive sequence with the process model comprises selecting one or more process model plug-ins for the process model, wherein each process model plug-in includes two or more of the second plurality of steps;

wherein the one or more process model plug-ins include a first process model plug-in configured to store and/or process test result data dispatched to the first process model plug-in in chunks, wherein chunk size is controllable by an auto-tuned threshold that is based on time measured for the dispatch and processing of prior results.

* * * * *